United States Patent
Nagarkar et al.

(10) Patent No.: US 9,720,105 B1
(45) Date of Patent: Aug. 1, 2017

(54) DOPED CESIUM BARIUM HALIDE SCINTILLATOR FILMS

(71) Applicant: Radiation Monitoring Devices, Inc., Watertown, MA (US)

(72) Inventors: Vivek V. Nagarkar, Weston, MA (US); Harish B. Bhandari, Brookline, MA (US)

(73) Assignee: Radiation Monitoring Devices, Inc., Watertown, MA (US)

(*) Notice: Subject to any disclaimer, the term of this patent is extended or adjusted under 35 U.S.C. 154(b) by 0 days.

(21) Appl. No.: 14/579,922

(22) Filed: Dec. 22, 2014

Related U.S. Application Data

(63) Continuation of application No. 13/564,672, filed on Aug. 1, 2012, now Pat. No. 8,957,386, which is a continuation-in-part of application No. 13/460,705, filed on Apr. 30, 2012, now Pat. No. 8,829,445.

(60) Provisional application No. 61/480,325, filed on Apr. 28, 2011, provisional application No. 61/514,000, filed on Aug. 1, 2011.

(51) Int. Cl.
  *G01T 1/202* (2006.01)
  *C23C 14/24* (2006.01)
  *C23C 14/06* (2006.01)

(52) U.S. Cl.
  CPC ........ *G01T 1/2023* (2013.01); *C23C 14/0694* (2013.01); *C23C 14/24* (2013.01); *C23C 14/243* (2013.01)

(58) Field of Classification Search
  CPC ......... G01T 1/20; G01T 1/202; G01T 1/2023; C23C 14/24; C23C 14/243
  See application file for complete search history.

(56) References Cited

U.S. PATENT DOCUMENTS

| | | |
|---|---|---|
| 4,668,480 A | 5/1987 | Fujiyashu et al. |
| 7,504,634 B2 | 3/2009 | Shah |
| 7,612,342 B1 | 11/2009 | Nagarkar |
| 8,674,311 B1 | 3/2014 | Nagarkar et al. |
| 8,829,445 B1 | 9/2014 | Nagarkar |
| 8,957,386 B1 | 2/2015 | Nagarkar et al. |
| 2007/0051896 A1 | 3/2007 | Okada et al. |
| 2007/0131874 A1 | 6/2007 | Srivastava et al. |
| 2007/0205371 A1 | 9/2007 | Inoue |
| 2008/0083877 A1 | 4/2008 | Nomura et al. |
| 2008/0286461 A1 | 11/2008 | Noguchi et al. |
| 2009/0008561 A1 | 1/2009 | Nagarkar et al. |
| 2009/0050811 A1 | 2/2009 | Barrett et al. |
| 2010/0230601 A1 | 9/2010 | Loureiro et al. |
| 2010/0268074 A1* | 10/2010 | Van Loef ............... A61B 6/032 600/431 |

OTHER PUBLICATIONS

Babla, et al. A triple-head solid state camera for cardiac single photon emission tomography. Proc. of SPIE 6319:63190M 1-5 (2006).

(Continued)

*Primary Examiner* — David Porta
*Assistant Examiner* — Faye Boosalis
(74) *Attorney, Agent, or Firm* — Wilson Sonsini Goodrich & Rosati

(57) ABSTRACT

Strontium halide scintillators, calcium halide scintillators, cerium halide scintillators, cesium barium halide scintillators, and related devices and methods are provided.

19 Claims, 15 Drawing Sheets

(56) References Cited

OTHER PUBLICATIONS

Bartzakos, et al. A PET detector with depth-of-interaction determination. Phys. Med. Biol. 3 6(6): 735-748 (1991).
Burr, et al. Evaluation of a prototype small-animal PET detector with depth-of-interaction encoding. IEEE Trans. NucL Sci. 51(4):1791-1798 (2004).
Co-pending U.S. Appl. No. 13/460,626.
Derenzo, et al. Initial characterization of a position-sensitive photodiode/BGO detector for PET. IEEE Trans. NucL Sci. 36(1):1-6 (1989).
Gramsch. Measurement of the depth of interaction of an LSO scintillator using a planar process ADP. IEEE Trans. on NucL Sci. 50 (3):307-312 (2003).
Huber, et al. An LSO scintillator array for a PET detector module with depth of interaction measurement. IEEE Trans. Nucl. Sci. 48:684-688 (2001).
Inadama, et al. A Depth of Interaction Detector for PET with GSO Crystals doped with Different amount of Ce. IEEE, 1099-1103 (2002).
Karp, et al. Depth-of-interaction determination in NaI(T1) and BGO scintillation crystals using a temperature gradient. Nucl. Instr. Methods Phys. Res. A260:509-517 (1987).
Knoll, "Pulse Shape Discrimination," in: Radiation Detection and Measurement, Third Edition, Glenn F. Knoll, John Wiley & Sons, NY, p. 646 (2000).
Knoll. Specialized Detector Configurations Based on Scintillation. in: Radiation Detection and Measurement, Second Edition, John Wiley & Sons, NY, p. 344-345 (1989).
Kupinski. Small-Animal SPECT Imaging, Springer Science+Business Media Inc. (2005).
Ling, et al. Depth of interaction decoding of a continuous crystal detector module. Phys. Med. Biol. 52:2213-2228 (2007).
MacDonald, et al. Depth of interaction for PET using segmented crystals. IEEE Trans. Nucl. Sci. 45(4):2144-2148 (1998).
Miyaoka, et al. Design of a depth of interaction (DOI) PET Detector Module. IEEE Trans. on Nucl. Sci. 45(3):1069-1073 (1998).
Moisan, et al. Segmented LSO crystals for depth-of-interaction encoding in PET. IEEE Trans. Nucl. Sci. 45(6):3030-3035 (1998).
Murayama, et al. Design of a depth of interaction detector with a PS-PMT for PET. IEEE Trans. Nucl. Sci. 47(3):1045-1050 (2000).
Nagarkar, et al. Development of microcolumnar Labr3:Ce scintillator. Proc. of SPIE 7450:745006-1-745006-10 (2009).
Nagarkar, et al. Microcolumnar and polycrystalline growth of LaBr3:Ce scintillator. Nucl. Instr. And Meth. A (2010), doi:10.1016/j.nima.2010.06.190.
Notice of allowance dated Sep. 22, 2014 for U.S. Appl. No. 13/564,672.
Office action dated Jun. 5, 2014 for U.S. Appl. No. 13/564,672.
Saoudi, et al. Investigation of depth-of-interaction by pulse shape discrimination in multicrystal detectors read out by avalanche photodiodes. IEEE Trans. Nucl. Sci. 46(3):462-467 (1999).
Schramm, et al. High-resolution SPECT using multi-pinhole collimation. IEEE Trans. Nucl. Sci. 50(3):774-777 (2003).
Seidel, et al. Depth identification accuracy of a three layer phoswich PET detector module. IEEE Trans. Nucl. Sci. 46(3):485-490 (1999).
Shah, et al. LcC13:Ce scintillator for y-ray detection. Nucl. Instr. and Meth. Phys. Res. A 505: 76-81 (2003).
Shao, et al. Dual APD array readout of LSO crystals: optimization of crystal surface treatment. IEEE Trans. Nucl. Sci. 49(3):649-654 (2002).
Smith, et al. Design of multipinhole collimators for small animal SPECT. IEEE NSS/MIC Conference Records (2004).
Stahle, et al. Fabrication of CdZnTe strip detectors for large area arrays. SPIE 3115:90-97 (1997).
Streun, et al. Pulse shape discrimination of LSP and LuYAP scintillators for depth of intereaction detection in PET. IEEE Trans. Nucl. Sci. 50(3):344-347 (2003).
Tornai, et al. Comparison of compact gamma cameras with 1.3- and 2.0-mm quantized. IEEE Trans. Nucl. Sci. 52(5):1251-1256 (2005).
Yamamoto, et al. A GSO depth of interaction detector for PET. IEEE Trans. NucNucl.Sci. 45(3): 1078-1082 (1998).
Yamashita, et al. High resolution block detectors for PET. IEEE Trans. Nucl. Sci. 37(2):589-593 (1990).

\* cited by examiner

DOPED CESIUM BARIUM HALIDE SCINTILLATOR FILMS

CROSS-REFERENCES TO RELATED APPLICATIONS

The present application is a continuation of U.S. patent application Ser. No. 13/564,672, filed Aug. 1, 2012, now U.S. Pat. No. 8,957,386, issued Feb. 17, 2015, which is a continuation-in-part of U.S. patent application Ser. No. 13/460,705, filed Apr. 30, 2012, now U.S. Pat. No. 8,829,445, issued Sep. 9, 2014, which claims priority to U.S. Provisional Application No. 61/480,325, filed Apr. 28, 2011, and claims priority to U.S. Provisional Application No. 61/514,000, filed Aug. 1, 2011, each of which are incorporated by reference in their entirety.

STATEMENT OF GOVERNMENT RIGHTS

This work was supported by the United States Army Medical Research Acquisition Activity under Grant No. W81XWH12C0057. The U.S. Government may have certain rights in this invention.

BACKGROUND OF THE INVENTION

The present invention relates to scintillator fabrication methods and scintillators. More specifically, the present invention provides a variety of scintillators, including strontium halide scintillators, calcium halide scintillators, cerium halide scintillators and cesium barium halide scintillators. Related devices and methods of using the scintillators described herein are also provided.

Scintillation spectrometers are widely used in detection and spectroscopy of energetic photons (e.g., X-rays and g-rays). Such detectors are commonly used, for example, in nuclear and particle physics research, medical imaging, diffraction, non-destructive testing, nuclear treaty verification and safeguards, nuclear non-proliferation monitoring, and geological exploration.

Important requirements for the scintillation materials used in these applications include high light output, transparency to the light it produces, high stopping efficiency, fast response, good proportionality, low cost and availability in large volume. These requirements are often not met by many of the commercially available scintillators. While general classes of chemical compositions may be identified as potentially having some attractive scintillation characteristic(s), specific compositions/formulations and structures having both scintillation characteristics and physical properties necessary for actual use in scintillation spectrometers and various practical applications, as well as capability of imaging at a high resolution, have proven difficult to predict or produce. Specific scintillation properties are not necessarily predictable from chemical composition alone, and preparing effective scintillators from even candidate materials often proves difficult. For example, while the composition of sodium chloride had been known for many years, the invention by Hofstadter of a high light-yield and conversion efficiency scintillator from sodium iodide doped with thallium launched the era of modern radiation spectrometry. More than half a century later, thallium doped sodium iodide, in fact, still remains one of the most widely used scintillator materials. Since the invention of NaI(Tl) scintillators in the 1940's, for half a century radiation detection applications have depended to a significant extent on this material. As the methodology of scintillator development evolved, new materials have been added, and yet, specific applications, particularly those requiring high resolution imaging and large volumes, are still hampered by the lack of scintillators suitable for particular applications.

As a result, there is continued interest in the search for new scintillator formulations and physical structures with both the enhanced performance and the physical characteristics needed for use in various applications. Today, the development of new scintillators continues to be as much an art as a science, since the composition of a given material does not necessarily determine its performance and structural properties as a scintillator, which are strongly influenced by the history (e.g., fabrication process) of the material as it is formed. While it is may be possible to reject a potential scintillator for a specific application based solely on composition, it is not possible to predict whether a material with promising composition will produce a scintillator with the desired properties.

Thus, a need exists for scintillators that have imaging capability with improved properties, such as spatial and/or temporal resolution, and methods of making the scintillators.

BRIEF SUMMARY OF THE INVENTION

The present invention relates to scintillator fabrication methods and scintillators. The scintillators of the invention are useful in a variety of applications including, for example, spectroscopy detection of energetic photons (X-rays and gamma-rays) and imaging applications (e.g., X-ray imaging, PET (positron emission tomography), etc.).

In one aspect, the present invention provides a scintillator comprising, a dopant and a scintillator material selected from the group consisting of strontium halide, calcium halide, and cesium barium halide, wherein the scintillator is in the form of a microcolumnar scintillator film or a non-columnar polycrystalline film. In one embodiment, the present invention provides a scintillator comprising a dopant and cesium barium halide. The scintillator films of the present invention can include $SrI_2$:Eu, $CaI_2$:Eu, $CeBr_3$, or $CsBa_2I_5$:Eu. In some embodiments, the scintillator films can include CaI or $CeBr_3$.

In another aspect, the present invention provides a radiation detection device including at least one of the scintillators provided herein (e.g., $SrI_2$:Eu, $CaI_2$:Eu, CaI, $CeBr_3$, or $CsBa_2I_5$:Eu); and a photodetector assembly optically coupled to the scintillator.

In yet another aspect, the present invention provides a method of performing radiation detection. The method can include providing a detector device including a scintillator provided herein (e.g., $SrI_2$:Eu, $CaI_2$:Eu, CaI, $CeBr_3$, or $CsBa_2I_5$:Eu); and a photodetector assembly optically coupled to the scintillator; and positioning a radiation source within a field of view of the scintillator so as to detect emissions from the radiation source.

In yet another aspect, the present invention provides methods of making a scintillator. The methods can include providing an evaporation apparatus comprising an evaporation chamber having a first end portion with a substrate positioned in a holder, and a second end portion with a first source boat separate from a second source boat, and one or more chamber walls at least partially disposed between the first and second end portions; positioning a dopant salt in the first source boat and a source salt in the second source boat; and depositing a scintillator film comprising a source and a dopant on a surface of the positioned substrate, wherein the source salt is selected from the group consisting of strontium halide, calcium halide, and cesium barium halide. In some embodiments, the hot wall evaporation techniques described herein can also be used to make $SrI_2$:Eu, $CaI_2$:Eu, or $CsBa_2I_5$:Eu scintillator films. In some embodiments, the hot wall evaporation techniques described herein can also be used to make $CeBr_3$ or CaI scintillator films.

In yet another aspect, the present invention includes a deposition method of making a doped cesium barium halide scintillator. The method can include providing a deposition apparatus comprising a vacuum chamber having a substrate at a first end and a scintillator source boat at a second end of the chamber; positioning a source material and a dopant material in the scintillator source boat; and depositing a scintillator film comprising doped cesium barium halide on the substrate.

For a fuller understanding of the nature and advantages of the present invention, reference should be had to the ensuing detailed description taken in conjunction with the accompanying drawings/figures. The drawings/figures represent embodiments of the present invention by way of illustration. The invention is capable of modification in various respects without departing from the invention. Accordingly, the drawings/figures and description of these embodiments are illustrative in nature, and not restrictive.

DETAILED DESCRIPTION OF THE INVENTION

Figure 1:
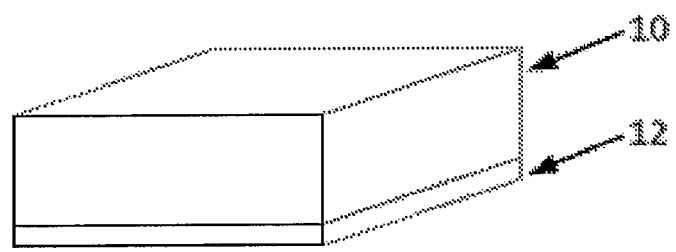
FIG. 1 illustrates an example scintillator film, according to one embodiment of the present invention.

The present invention relates to scintillator fabrication methods and scintillators. More specifically, the present invention provides a variety of scintillators, including strontium halide scintillators, calcium halide scintillators, cerium halide scintillators and cesium barium halide scintillators. Related devices and methods of using the scintillators described herein are also provided.

The methods and structures described herein can be used to make a variety of scintillator compositions. For example, the present invention provides, but is not limited to, strontium halide scintillators, calcium halide scintillators, cerium halide scintillators, or cesium barium halide scintillators. Halides can include fluoride, chloride, bromide and/or iodide. The scintillators can include strontium iodide-based (e.g., $SrI_2$) scintillator compositions. In some embodiments, the scintillators include cerium bromide (e.g., $CeBr_3$) scintillator compositions. Cesium barium iodide-based (e.g., $CsBa_2I_5$) scintillator compositions are also provided. Calcium iodide scintillators (e.g., $CaI_2$, $CaI_2$:Eu, and $CaI_2$:Tl) are further provided herein. Other halide scintillators, include, but are not limited to, doped $SrBr_2$, $CaBr_3$, and $CeCl_3$.

The scintillator compositions of the present invention can optionally include a "dopant." In certain embodiments, the scintillators described herein will typically include a dopant. Dopants can affect certain properties, such as physical properties (e.g., brittleness, etc.) as well as certain scintillation properties (e.g., afterglow, etc.) of the scintillator composition. The dopant can include, for example, europium (Eu), praseodymium (Pr), cerium (Ce), thallium (Tl), terbium (Tb), ytterbium (Yb), and mixtures of any of the dopants. The amount of dopant present will depend on various factors, such as the application for which the scintillator composition is being used; the desired scintillation properties (e.g., emission properties, timing resolution, etc.); and the type of detection device into which the scintillator is being incorporated. For example, the dopant is typically employed at a level in the range of about 0.1% to about 20%, by molar weight. In some embodiments, the amount of dopant is in the range of about 0.1% to about 100%, or about 0.1% to about 5.0%, or about 5.0% to about 20%, by molar weight. In one embodiment, the scintillators can include $SrI_2$:Eu scintillator compositions. In another embodiment, the scintillators can include $CsBa_2I_5$:Eu scintillator compositions. As will be appreciated by one of ordinary skill in the art, cesium barium iodide is also termed barium cesium iodide (or europium-doped barium cesium iodide, or $Ba_2CsI_5$:Eu). Doped cesium barium halide scintillator films of the present invention can also include dual-doped scintillator films, e.g., $Ba_2CsI_5$:Eu+Tl. In some embodiments, the scintillators can include $CaI_2$, $CaI_2$:Eu, or $CaI_2$:Tl scintillator compositions.

The scintillators described herein (e.g., $SrI_2$:Eu, $CaI_2$:Eu, $CeBr_3$, or $CsBa_2I_5$:Eu scintillators) can be produced in a variety of different forms. As shown in FIG. 1, the scintillators can be a film 10 deposited on a substrate 12. For example, the scintillators described herein can be polycrystalline or crystalline. In certain embodiments, the scintillators described herein can be microcolumnar scintillators. Column widths of the microcolumnar scintillators can be, e.g., greater than about 5 microns in width. In some embodiments, the columns can have widths between 5 microns and 100 microns, between 100 microns and 1 millimeter, or higher. An upper limit for the microcolumns can be a width that is the same as the thickness of the film. In some embodiments, the scintillators described herein are in the form of a polycrystalline film. The scintillators can be a microcolumnar scintillator film. In some embodiments, scintillators can be produced as transparent or translucent scintillators that include a crystalline or polycrystalline layer(s).

The present invention further includes doped cesium barium halide scintillators (e.g., $CsBa_2I:Eu$) in various forms, including an amorphous microcolumnar structure form or a crystalline microcolumnar structure form. The doped ternary scintillator, $CsBa_2I:Eu$, can exist as a monophase that is not a solid solution of Cs, Ba, I, but rather a compound with chemical bonding amongst Cs, Ba, and I, as well as Eu. The ternary compound structure can be unstable under certain conditions. Accordingly, to produce an optimally functioning scintillator, a scintillator in the monophase can be produced in which, e.g., Cs, Ba, I and Eu can be kinetically trapped in an arrangement that generates excellent scintillation properties. For example, $Ba_2CsI_5$ is formed in-part from the reaction of $BaI_2$ and $CsI$ binary compounds. However, while not being limited to any particular theory, when energy is applied over a long period of time on such ternary compounds, the thermodynamically stable product will result, which are $BaI_2$ and $CsI$, not $Ba_2CsI_5$. Binary compounds can exhibit higher lattice stability owing, e.g., to their simplicity in bond formation. Hence, ternary compounds can be less stable and difficult to form if the thermodynamics prefer more stable binary compounds. For $Ba_2CsI_5$, the melting points of $CsI$ and $BaI_2$ are 630° C. and 740° C. However, when a mono-phase of $Ba_2CsI_5$ is synthesized from the reaction of the two binary phases, the melting point of the ternary phase is ~600° C., which is lower than its constituent binary phases. With a lower melting point than $CsI$, $Ba_2CsI_5$ would be expected to have a higher vapor pressure than $CsI$. However, via indirect experimentation it was discovered that the vapor pressure for $Ba_2CsI_5$ was lower, not higher, than $CsI$. Typically, to improve vapor pressure of a material, the temperature can be increased. However, increased temperature for $Ba_2CsI_5$, e.g., beyond its melting point can cause phase separation into $BaI_2$ and $CsI$. Owing in part to this discovery, the methods (e.g., hot wall evaporation, thermal evaporation or physical vapor deposition) of making doped cesium barium halide scintillator films described herein account for this lower vapor pressure and allow for fabrication of the doped cesium barium halide scintillator films. The methods can also include other ways to address the properties of doped cesium barium halide scintillator films. For example, a finely powdered charge of $Ba_2CsI_5:Eu$ can be sublimated from a customized boat that facilitates a large surface area and will provide enough vaporization compared to single planar surface of liquid-melt. In addition, as described further herein, the present invention further includes making doped cesium barium halide polycrystals (e.g., $Ba_2CsI_5:Eu$ polycrystals) that have a monophase prior to vaporization, which can be used to generate monophase films (e.g., $Ba_2CsI_5:Eu$ films).

The scintillators described herein can be produced in a variety of thicknesses and spatial areas. Thicknesses of the films can be designed for certain imaging applications. For example, thin films (e.g., less than 20 μm) can be used to detect alpha particles, while limiting interference from detection of gamma rays. Thickness of the films can also be tailored to detect, for example, gamma rays, while also allowing for sufficient light transmission. Spatial resolution for, e.g., microcolumnar scintillators, can also be tailored by thickness of the films. In some embodiments, scintillators can be produced as a thin film, e.g., films having a thickness ranging from about 10 μm to about 1 cm. In certain embodiments, the scintillators can be thick films having a thickness of 1 cm or greater, and can be referred to as "slabs." In some embodiments, scintillators can have thickness of less than about 20 microns, less than about 500 microns, or less than about 1 cm. In certain embodiments, the scintillators can have a thickness greater than about 1 cm, greater than about 3 cm, or greater than about 5 cm. The scintillators described herein can be freestanding films, e.g., where the deposited film can be removed from the substrate after deposition. The scintillators can be deposited over small to wide areas on the order, for example, of $mm^2$ or $cm^2$ (e.g., up to 50×50 $cm^2$).

Scintillator compositions and assemblies of the present invention can further include one or more reflective coatings, e.g., formed on a substrate surface or otherwise coupled with a scintillator. In one embodiment, a reflective coating can be formed on a substrate surface prior to deposition of the scintillator, such as in the case of opaque substrates. One embodiment includes the use of substrates such as alumina that are themselves white in color and act as an excellent reflector. Another embodiment includes the use of substrates that are themselves photodetectors (e.g., SSPMs, amorphous silicon arrays, CCDs, and CMOS devices). For graphite-like substrates, reflective metal coatings can be formed. In addition to being highly reflective, such coatings may be required to withstand high process temperatures, maintain adhesion to the substrate during and after deposition, and/or be chemically inert with the scintillator or suitable for coating with a chemically inert material, such as an organic polymer or resin (e.g., Parylene C). For transparent substrates a reflective coating can be applied atop the scintillator film directly or after deposition of one or more other coatings, such as a Parylene coating. As noted above, various coating technologies can be utilized for forming coatings with the required optical and/or protective properties.

In some embodiments, a protective coating can be deposited or placed over the scintillator film to protect it, e.g., from air and/or moisture. For example, a $Ba_2CsI_5:Eu$ scintillator film is hygroscopic and can degenerate when exposed to moisture. In one embodiment, a parylene film can be deposited on the scintillator. In an alternative embodiment, another less hygroscopic scintillator can be coated on the $Ba_2CsI_5:Eu$ scintillator film. For instance, a doped or undoped cesium halide scintillator film (e.g., that is tens of microns in thickness) can be deposited near the end of the deposition cycle of the $Ba_2CsI_5:Eu$ scintillator film. A source boat including cesium halide can, e.g., be evaporated during the deposition cycle to deposit the cesium halide over the $Ba_2CsI_5:Eu$ scintillator film. In some embodiments, a parylene film can also be added on top of the cesium halide film. Experimental evidence has further shown, e.g., that a top layer of CsI of a few microns is transparent to the light emitted in the scintillator and also continues to grow along the same columnar geometry as the scintillator.

The present invention includes methods and structures for fabricating the scintillators described herein. In some embodiments, the scintillators described herein can be grown using a vapor deposition technique, co-evaporation in a hot wall evaporation (HWE) apparatus. In certain embodiments, the hot wall evaporation techniques can include hot wall epitaxial growth of the scintillators described herein. Hot wall evaporation techniques, as described herein, include a vacuum deposition technique where scintillator film is efficiently deposited on a surface of a substrate. In the simplest form the HWE apparatus includes a chamber or cylinder positioned in a vacuum, heated, with an evaporation source "boat" or reservoir at one end (typically the bottom in an upright positioned chamber) and a temperature controlled substrate at the other (typically the top in an upright positioned chamber). In certain embodiments, the disclosed methods make use of salts and vapor deposits them, e.g., simultaneously, on a suitable substrate using two independent sources. Under different deposition conditions, the material grows in the desired form. In one embodiment, two source boats are used to accomplish co-evaporation of a salt and a dopant salt for deposition of a scintillator film on a substrate surface. In some embodiments, the HWE techniques can include three or more source boats. Each boat can contain a particular source material (a.k.a. charge) of interest to produce the scintillators described herein. The source boats can be positioned separate (e.g., laterally spaced) from each other.

Figure 2:
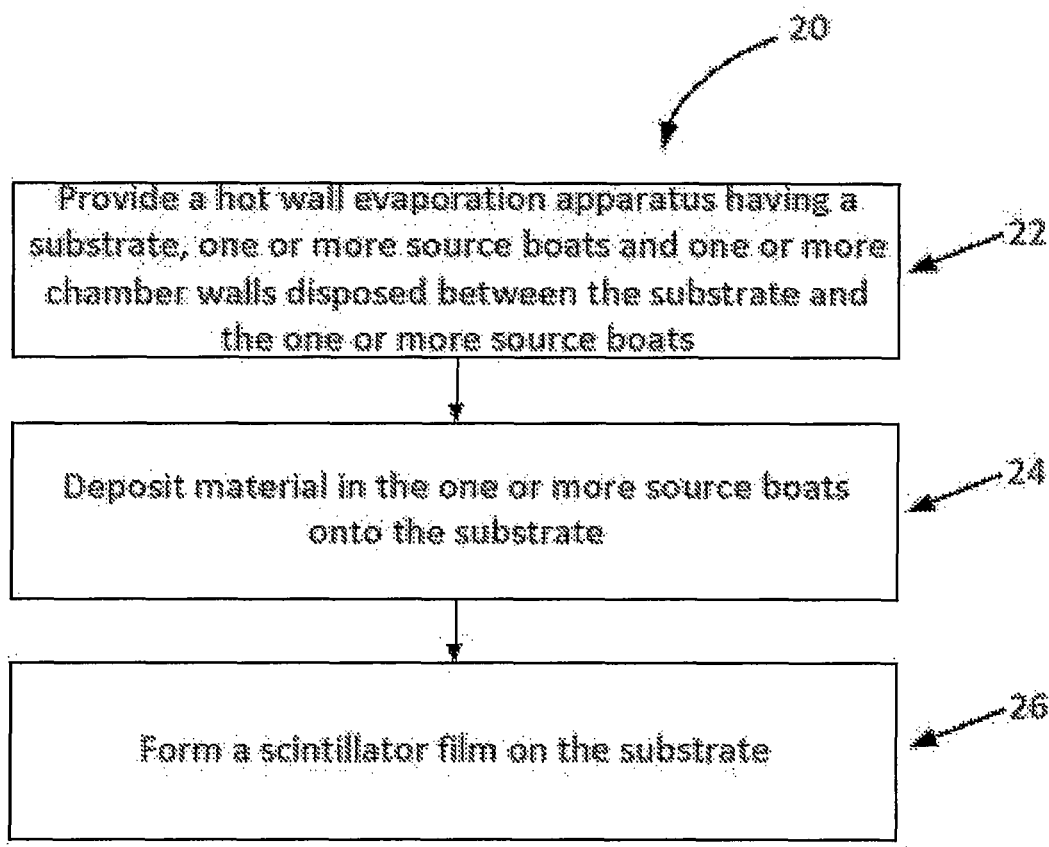
FIG. 2 shows a hot wall evaporation method, according to an embodiment of the present invention.

FIG. 2 provides an example method 20 for performing hot wall evaporation to make a doped scintillator film, such as a doped cesium halide scintillator. In general, the method can include providing a hot wall evaporation apparatus having a substrate, one or more source boats and one or more chamber walls disposed between the substrate and the one or more source boats 22. Material in the one or more source boats can be deposited onto the substrate 24, and a scintillator material (e.g., a strontium halide, calcium halide, cerium halide, or cesium barium halide scintillator film) can be formed on the substrate 26.

Figure 3:
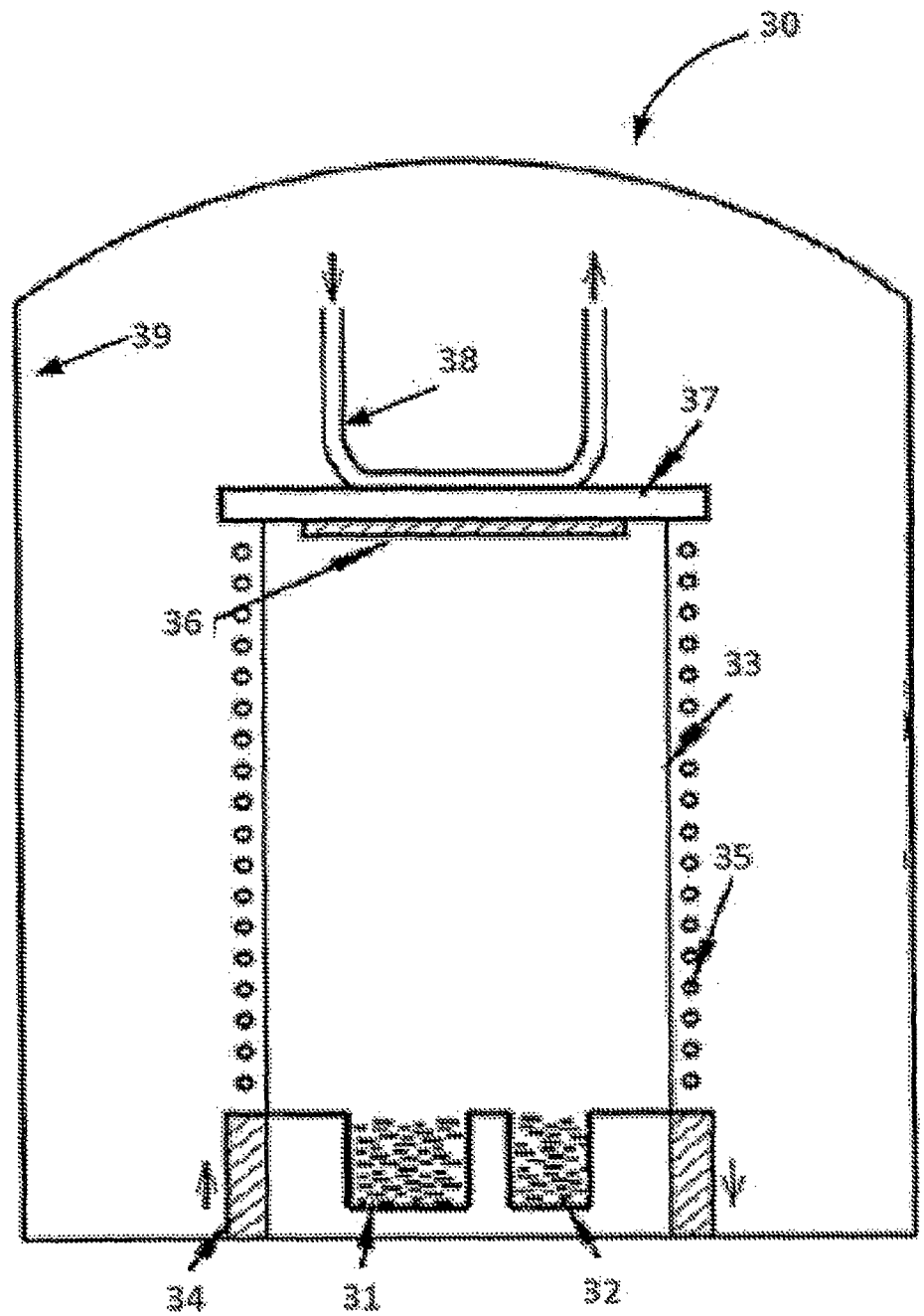
FIG. 3 shows a hot wall evaporation apparatus, according to an embodiment of the present invention.

FIG. 3 shows an example hot wall evaporation apparatus 30 for use in the present invention, e.g., for making a doped cesium barium halide scintillator film. A first precursor boat 31 (e.g., CsI and $BaI_2$ starting material) and a first precursor boat 32 (e.g., $EuI_2$ dopant material) are co-located at one end of a hot wall column 33 (e.g., a metallic cylinder). Heater electrodes 34 are located next to the precursor boats, and resistive heaters 35 are provided around the hot wall column to heat to a temperature, $T_{wall}$. A substrate 36 is positioned at the other end of the hot wall column opposing the precursor boats 31, 32. The substrate 36 is contacted to a cooled substrate holder 37 that can be cooled, e.g., by a liquid cooling system 38. The components of the apparatus 30 are provided in a vacuum chamber 39. In one embodiment, temperature ranges for making $SrI_2$:Eu can be $T_{wall}$ from about 750° C. to about 800° C., $T_{source}$ from about 500° C. to about 700° C., and $T_{substrate}$ can be from about 300° C. to about 450° C.

Figure 4:
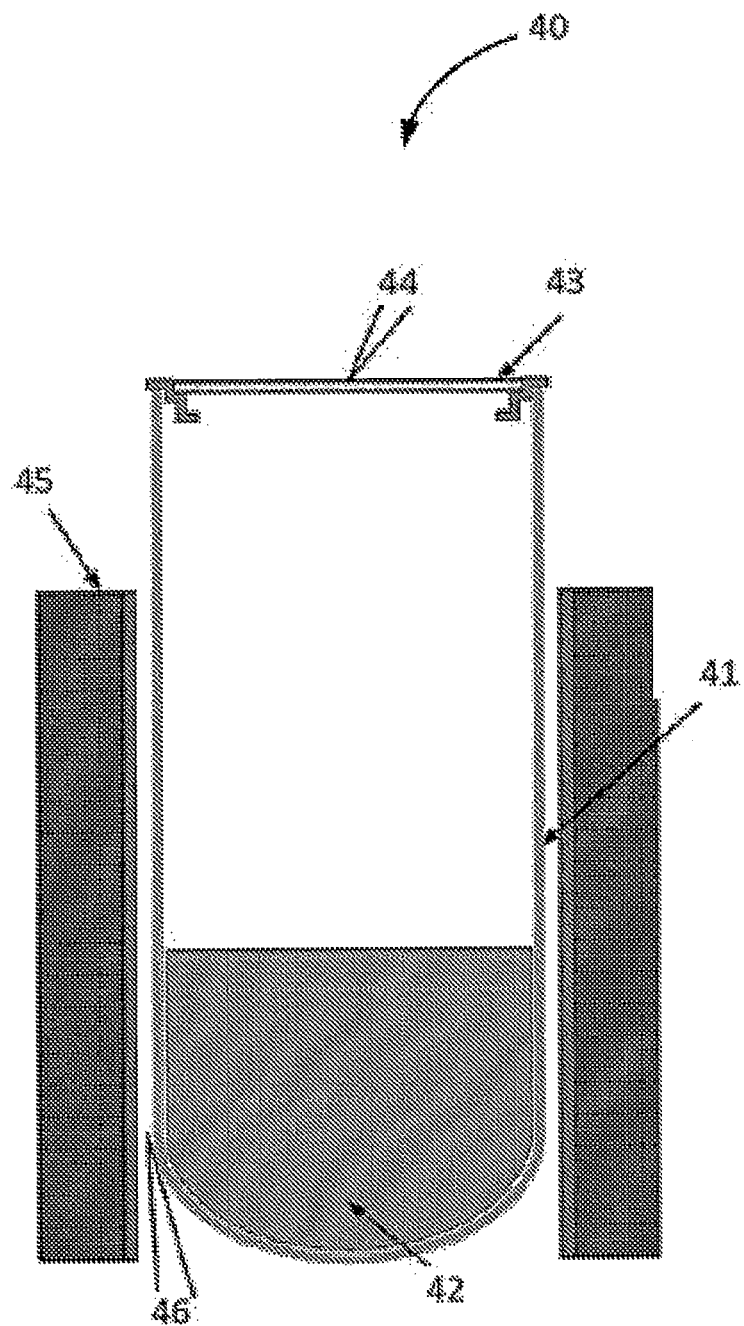
FIG. 4 shows a hot wall evaporation apparatus, according to an embodiment of the present invention.

FIG. 4 shows another example hot wall evaporation apparatus 40 for use in the present invention. In one form the HWE apparatus includes a chamber or cylinder (e.g., a quartz crucible) 41 positioned in a vacuum, heated, with an evaporation source "boat" or reservoir holding a source material 42 (e.g., $Ba_2CsI_5$:Eu polycrystals) at one end (typically the bottom in an upright positioned chamber) and a temperature controlled substrate 43 at the other (typically the top in an upright positioned chamber). In an example of making $SrI_2$:Eu, the temperature of the substrate 43 can be controlled with a thermocouple 44, such that, e.g., the substrate has a temperature between about 300° C. and about 450° C. The chamber or cylinder can be heated by chamber walls including a heater 45 that can include a thermocouple 46 configured to heat the chamber or cylinder at temperatures, e.g., between about 750° C. to about 800° C. In general, source material temperatures are at least the melting points of the materials used; e.g., 5% to 10% above the source material's ° C. melting point.

For HWE, the heated cylinder wall serves to enclose, deflect and effectively direct the vapor from the source to the substrate where molecules are deposited with a shallow impinging angle. With the substrate being the coolest part in the system (e.g., compared to the cylinder wall and source material), molecules adhere solely or primarily to the substrate and do not substantially accumulate on the hot walls, making efficient use of the source material. To ensure thermodynamic equilibrium the relationship between the substrate temperature and that of the source and the heated wall should be: $T_{wall} > T_{source} > T_{substrate}$. After deposition, the deposited scintillator material can be annealed in a variety of atmospheric conditions. Annealing can be used to enhance the performance of the scintillators described herein.

An advantage of HWE is that it preserves the composition of the grown film with reference to the evaporants even though they have relatively large differences in vapor pressures and sticking coefficients. This is due to the fact that HWE takes place under conditions of thermodynamic equilibrium, which allows the high vapor pressures of various compounds to be maintained. As a result, the dissociation of various constituents does not present a problem for film growth. As a matter of fact, the interaction of components with each other on the substrate surface can lead, under favorable growth conditions, to the formation and growth of the well-structured films.

Deposition of microcolumnar films involves methods where the evaporated material be incident on the substrate at a grazing angle. HWE creates this condition through minimized mean free path for the vaporized molecules due to the large density of evaporated material, and through efficient reflection of molecules from walls, which are maintained at the highest temperature in the setup. Thus, the thermodynamic equilibrium and atmosphere conducive to growth created by the HWE process allows deposition of stoichiometrically balanced films with well-separated columnar morphology.

Another aspect of HWE is its high (close to 100%) deposition efficiency, as the substrate is the coldest part of the evaporation environment. As a result, vapors that impinge on HWE system parts, including the hot walls, are deflected and mostly condense only on the relatively cool substrate. Consequently, material loss is at a minimum, enhancing the deposition efficiency to 95% or more (and greatly simplifying apparatus cleaning and maintenance).

A feature of HWE for thick film deposition is that the growth rate is an order of magnitude higher than that of conventional physical vapor deposition (PVD) systems. For a single evaporant material system the deposition rate is proportional to the impingement rate (Ø) of atoms on the substrate at constant temperature, and is governed by the equation (1):

$$Ø = n(kT/2\Pi m)^{1/2} \qquad (1)$$

where n is the number of evaporant molecules per unit volume, k is the Boltzmann constant, T is the source temperature, and m is the mass of the molecule. For hot wall evaporation, a two-evaporant system, this equation still holds, since the vapor phases of the constituent compounds are in equilibrium with the source materials. Therefore, the two evaporant deposition process is basically very similar to that for a single evaporant material. As the source temperature T is very high and the substrate is the coldest part in the evaporator, the impingement rate of molecules and, hence, the film growth rate is an order of magnitude higher than with conventional systems. The growth rate is related to the impingement rate by the following equation (2):

Growth rate={Ø*Average thickness of a monolayer}/ {Surface density of the scintillator composition}   (2)

The process of material growth can consist of a series of events that begin with the physical adsorption of a fraction of the incident molecules on the substrate or by forming a stable nucleus by interaction with the other adsorbed molecules. This process of nucleation and growth is typical for the formation of a film of one material on a substrate of a different material. In HWE, no nucleation takes place, but growth occurs by direct adsorption of the molecules on low energy sites, such as kinks on an atomic ledge on the substrate. Under these conditions, even when the growth rate is very high, a monolayer-by-monolayer deposition is obtained resulting in excellent stoichiometry of the films.

In some embodiments, there can be additional modifications to the methods and apparatus for making strontium halide scintillators (e.g., $SrI_2$:Eu). For example, $SrI_2$:Eu is a highly corrosive material, so a cold trap is used to protect vacuum pumps. Also, chamber cleaning after deposition is important. Substrate cooling is necessary, since wall temperatures are high. A planetary system can be used which rotates at least one substrate around a system axis as well as around an axis that is normal to the surface of the substrate. A rate of about 1 to 2 rotations per second would be used. Deposition parameters (e.g., temperatures) are adjusted accordingly to achieve a high growth rate of about 10 to about 25 microns per minute, with good thickness uniformity (say, 5% to 10%). For example, gamma detectors use thick sensors for the sake of detection efficiency, so high growth rates are desirable.

In certain embodiments, temperature control for making strontium halide can occurs in three stages: (1) Ramp-up: From ambient room temperature to a range of about 500° C. to about 700° C., about 3 hours, at a slow rate in order to allow and achieve the necessary dehydration of source materials before beginning deposition. Otherwise, moisture in the source materials can vaporize rapidly, causing undesirable sputtering of source materials; (2) Deposition: Temperatures are held at the desired level; e.g., within the range of about 500° C. to about 700° C. Deposition proceeds for a period of time that depends upon the desired scintillator thickness; (3) Ramp-down: The temperature is slowly decreased to ambient room temperature, from about 5 to 10 hours, in order reduce stress on the deposited film. Vacuum is achieved and held between about $10^{-4}$ to about $10^{-7}$ Torr. Source materials are heated to temperatures that are at least (e.g., by 5% to 10%) their melting points; e.g., for $SrI_2$:Eu, the $SrI_2$ source would be heated to about 500° C., and the $EuI_2$ source would be heated to about 875° C. The evaporation rates for $SrI_2$ and $EuI_2$ to produce $SrI_2$:Eu with 2% to 5% Eu doping, for example, can be about 25 microns/minute for $SrI_2$ and about 0.5 to about 1.25 microns per minute for $EuI_2$.

Similar processes can be used to make calcium halide scintillators. Material vaporization temperatures for the calcium halide source and dopant materials can be slightly above (e.g., by 5% to 10%) respective melting points. For $CaI_2$:Eu and $CaI_2$:Tl, the melting point for $CaI_2$ is about 783° C., $EuI_2$ about 875° C., and TlI about 300° C. For $Ba_2CsI_5$:Eu, the process is the same, except a vaporization temperature between about 500° C. and about 600° C. can be used for the source material, polycrystalline $Ba_2CsI_5$:Eu, which can be prefabricated by melt growth from an admixture of $BaI_2$, CsI and $EuI_2$.

The present invention further includes other deposition methods for making doped cesium barium halide scintillator films. For example, a variety of physical vapor deposition apparatus and methods (e.g., sputtering or electron beam vaporization) can be used. Thermal deposition techniques can also be used. In one embodiment, the methods can include providing a deposition apparatus comprising a vacuum chamber having a substrate at a first end and scintillator source boat at a second end of the chamber; positioning a cesium barium halide source material and a dopant material at the second end; and depositing a scintillator film comprising doped cesium barium halide on the substrate. The source material and dopant material can be provided in a variety of ways. For example, a single crystal and/or polycrystals of doped cesium barium halide, e.g., $Ba_2CsI_5$:Eu, can be synthesized using vertical Bridgeman growth processes. The crystal(s) can then be evaporated and deposited on the substrate to form the doped cesium barium halide scintillator film. Alternatively, the source material (e.g., CsI and $BaI_2$) can be co-evaporated in separate boats along with the dopant material (e.g., $EuI_2$) and subsequently made to react on a heated substrate to form the monophase of $CsBa_2I_5$:Eu. Temperatures for initiating the reaction can range, e.g., from about room temperature (25° C.) to about 450° C.

As set forth above, scintillator compositions of the present invention may find use in a wide variety of applications. In one embodiment, for example, the invention is directed to a method for detecting energetic (e.g., ionizing) radiation (e.g., gamma-rays, X-rays, neutron emissions, alpha particles, beta particles and the like) with high energy resolution using a detector based on a scintillator described herein. In certain embodiments, the microcolumnar form of scintillators described herein can be used for high spatial resolution imaging.

Figure 5:
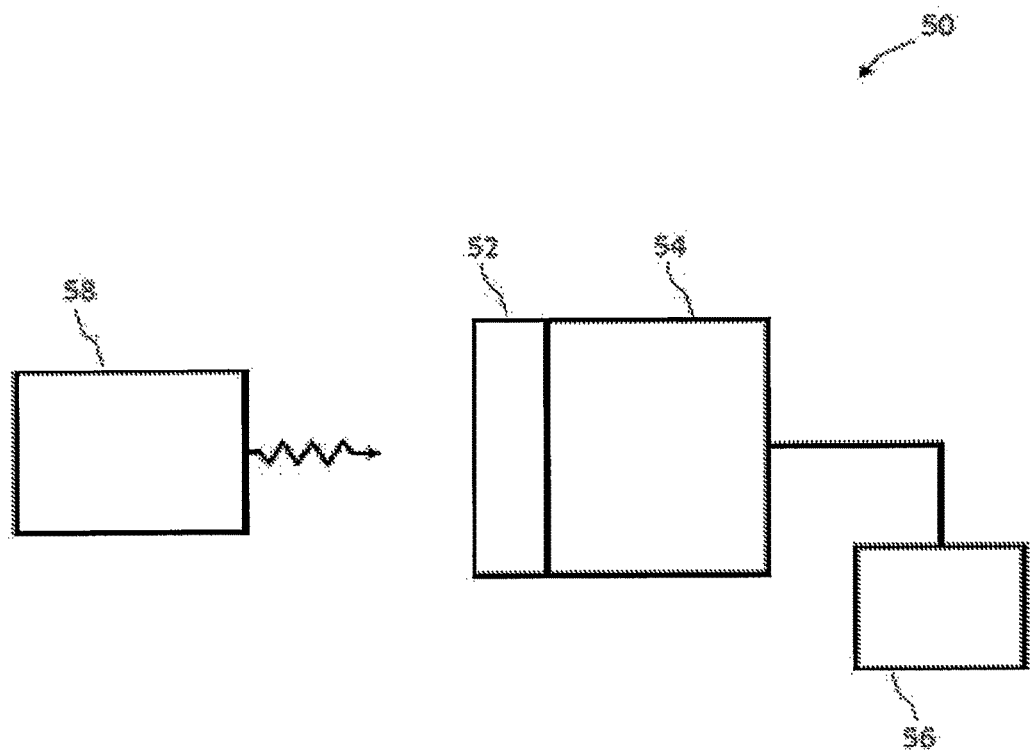
FIG. 5 shows an example detection device, according to an embodiment of the present invention.

FIG. 5 is a diagram of a detector assembly or radiation detector of the present invention. The detector 50 includes a doped cesium barium halide scintillator 52 operably coupled to a light photodetector 54 or imaging device. The detector assembly 50 can include a data analysis, or computer, system 56 to process information from the scintillator 52 and light photodetector 54. In use, the detector 50 detects energetic radiation emitted form a source 58.

A data analysis, or computer, system thereof can include, for example, a module or system to process information (e.g., radiation detection information) from the detector/photodetectors in an invention assembly and can include, for example, a wide variety of proprietary or commercially available computers, electronics, or systems having one or more processing structures, a personal computer, mainframe, or the like, with such systems often comprising data processing hardware and/or software configured to implement any one (or combination of) the method steps described herein. Any software will typically comprise machine readable code of programming instructions embodied in tangible media such as a memory, a digital or optical recording medium, optical, electrical, or wireless telemetry signals, or the like, and one or more of these structures may also be used to transmit data and information between components of the system in any of a wide variety of distributed or centralized signal processing architectures.

The detector assembly typically includes material formed from the scintillator compositions described herein (e.g., $SrI_2$:Eu, $CaI_2$:Eu, $CeBr_3$, or $CsBa_2I_5$:Eu scintillators). The detector further can include, for example, a light detection assembly including one or more photodetectors. Non-limiting examples of photodetectors include photomultiplier tubes (PMT), PIN detectors, photodiodes, charge coupled device (CCD) sensors, image intensifiers, avalanche detectors and the like. Choice of a particular photodetector will depend in part on the type of radiation detector being fabricated and on its intended use of the device. In certain embodiments, the photodetector may be position-sensitive. Detectors can further include imaging devices that can acquire images at high frame rates, such as frame rates that are faster than about 30 frames per second, about 100 frames per second, or about 1000 frames per second.

The detector assemblies themselves, which can include the scintillator and the photodetector assembly, can be connected to a variety of tools and devices, as mentioned previously. Non-limiting examples include nuclear weapons monitoring and detection devices, well-logging tools, and imaging devices, such as nuclear medicine devices (e.g., PET). Various technologies for operably coupling or integrating a radiation detector assembly containing a scintillator to a detection device can be utilized in the present invention, including various known techniques. In certain embodiments, the radiation detector comprises a scintillator described herein formed on a substrate that is optically coupled to the photodetector. Similarly, scintillator screens including a scintillator described herein can be included in a radiation detector such that the screen is optically coupled to the photodetector.

The detectors may also be connected to a visualization interface, imaging equipment, or digital imaging equipment (e.g., pixilated flat panel devices). In some embodiments, the scintillator may serve as a component of a screen scintillator. Energetic radiation, e.g., X-rays, gamma-rays, neutron, originating from a source, would interact with the scintillator and be converted into light photons, which are visualized in the developed film. The film can be replaced by amorphous silicon position-sensitive photodetectors or other position-sensitive detectors, such as avalanche diodes and the like. In some embodiments, neutrons can be indirectly detected by coupling (e.g., incorporating into or contacting) an absorbing converter material, such as but not limited to lithium, boron or gadolinium, into/with a scintillator described herein, and then detecting emissions (e.g., X-rays and/or alpha particles) produced by interactions between the neutrons and the absorbing converter material.

The methods of the present invention further include methods of performing radiation detection. The methods of performing radiation detection can include providing a detection device comprising a scintillator composition including a scintillator described herein; and a photodetector assembly operably (e.g., optically) coupled to the scintillator composition; and positioning the device such that a radiation source is within a field of view of the scintillator composition so as to detect emissions from the source. Emissions from the source can include x-rays, gamma-rays, neutrons, alpha particles, beta particles, or a combination thereof. In certain embodiments, a material (e.g., a patient, plant, animal, object, liquid, or gas) can be positioned between the radiation source and the scintillator composition. In some embodiments, the radiation source includes a material (e.g., a patient, plant, animal, object, liquid, or gas). In another embodiment, a material of interest (e.g., a patient, plant, animal, object, liquid, or gas) may scatter energetic radiation to the scintillator. The methods of radiation detection may also include X-ray and gamma ray astronomy and cosmic ray detection (e.g., in salt mines). In certain embodiments, a material to be analyzed can be positioned between the radiation source and the scintillator. In some embodiments, the radiation source includes a patient. In some embodiments, the detector can be positioned such that the radiation source is in the field of view of the scintillator. Alternatively, the radiation source can be positioned in the field of view of the scintillator contained in the detector. Also, both the radiation source and the detector can be moved at the same time such that the radiation source is in the field of view of the scintillator.

Imaging devices, including medical imaging equipment, such as PET and SPECT (single-photon emission computed tomography) devices, and the like, represent other potential applications for the invention scintillator compositions and radiation detectors. Furthermore, geological exploration devices, such as well-logging devices, were mentioned previously and represent an important application for these radiation detectors. The assembly containing the scintillator usually includes, for example, an optical window at one end of the enclosure/casing. The window permits radiation-induced scintillation light to pass out of the scintillator assembly for measurement by the photon detection assembly or light-sensing device (e.g., photomultiplier tube, etc.), which is coupled to the scintillator assembly. The light-sensing device converts the light photons emitted from the scintillator into electrical pulses that may be shaped and digitized, for example, by the associated electronics. By this general process, gamma rays can be detected, which in turn provides an analysis of geological formations, such as rock strata surrounding the drilling bore holes.

In applications of a scintillator composition, including those set forth above (e.g., nuclear weapons monitoring and detection, imaging, and well-logging and PET technologies), certain characteristics of the scintillator are desirable, including its light output (higher is can be preferred), rise time (faster can be preferred) and decay time (shorter can be preferred), timing shape (e.g., fixed or varying, depending upon dopant concentration used to analyze scintillation events), energy resolution (finer/lower % can be preferred), spatial resolution (finer, e.g., higher, can be preferred), and suitable physical properties. The present invention is expected to provide scintillator materials which can provide the desired high light output and initial photon intensity characteristics for demanding applications of the technologies. Furthermore, the scintillator materials are also expected to be produced efficiently and economically, and also expected to be employed in a variety of other devices which require radiation/signal detection (e.g., gamma-ray, X-ray, neutron emissions, and the like).

The following examples are provided to illustrate but not limit the invention.

EXAMPLES

Example 1

Fabrication of SrI$_2$:Eu (Europium-Doped Strontium Iodide) Scintillator Films

This example describes fabrication of polycrystalline microcolumnar scintillator films of europium-doped strontium iodide (SrI$_2$:Eu). A wide range of uniform thickness SrI$_2$:Eu films can be made ranging from less than 1 mm to greater than 1 cm. Films having diameters of 7 cm or more can also be fabricated. The hot wall evaporation methods described herein can be used to make the SrI$_2$:Eu films, and since SrI$_2$:Eu is highly deliquescent the apparatuses and methods can provide encapsulation techniques for protecting the materials. Scintillation properties can be optimized for a variety of applications.

Figure 6:
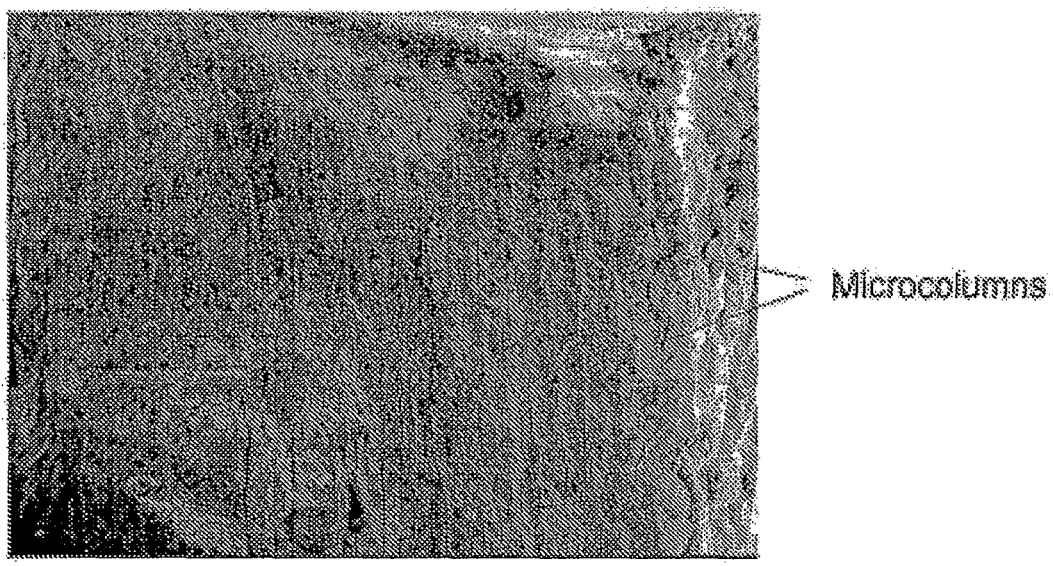
FIG. 6 shows a microcolumnar structure of a $SrI_2$:Eu scintillator film, according to an embodiment of the present invention.

A variety of hot wall evaporation deposition conditions can be used. FIG. 3 shows an example hot wall evaporation apparatus used to deposit the $SrI_2$:Eu films. In this example, 20 grams of $SrI_2$ was placed in one precursor boat and 2.5 grams of $EuI_2$ was placed in a second precursor boat. The maximum evaporation temperature was about 800° C. The base pressure in the apparatus was $10^{-5}$ torr. Deposition time was three hours with 30 minutes of dwell time at 800° C. and 2.5 hours of ramp-up and ramp-down time total. The thickness of the film was 7 mm maximum with a slight parabolic profile. Another film was fabricated that was 38 mm in diameter and approximately 7 mm thick. The light emission of the film was 59,500 ph/MeV, as normalized to the quantum efficiency of the measuring system. $SrI_2$:Eu had an emission wavelength at 435 nm. The films were encapsulated, hermetically sealed in an aluminum enclosure with a quartz window on one side. Residual window sealant in the capsule reacted with the $SrI_2$:Eu causing white and yellow discoloration around the periphery. As shown in FIG. 6, scanning electron microscopy showed a microcolumnar structure of the deposited $SrI_2$:Eu film, which can improve imaging resolution by channeling light to the surface of the film and to a photodetector.

Gamma ray spectra were compared between a 1.2 mm thin film of $SrI_2$:Eu and a single crystal of $LaBr_3$:Ce. The shaping time for $LaBr_3$:Ce was 0.25 microseconds, and the shaping time for $SrI_2$:Eu was 4 microseconds. The gamma source was Co-57 (122 keV). The gamma light yield for the $LaBr_3$:Ce single crystal was 52,000 ph/MeV and 59,500 ph/MeV for the 1.2 mm thin film of $SrI_2$:Eu.

Example 2

Fabrication of $CeBr_3$ Scintillator Films

Figure 7A:
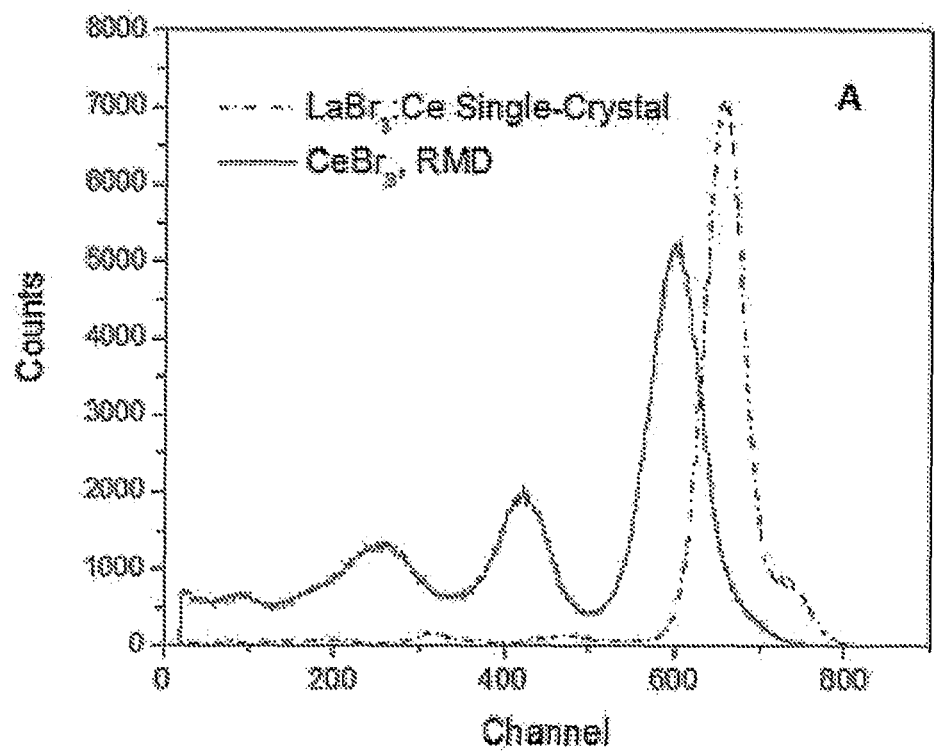
FIGS. 7A and 7B provide spectra of a cerium bromide scintillator film, according to an embodiment of the present invention.
Figure 7B:
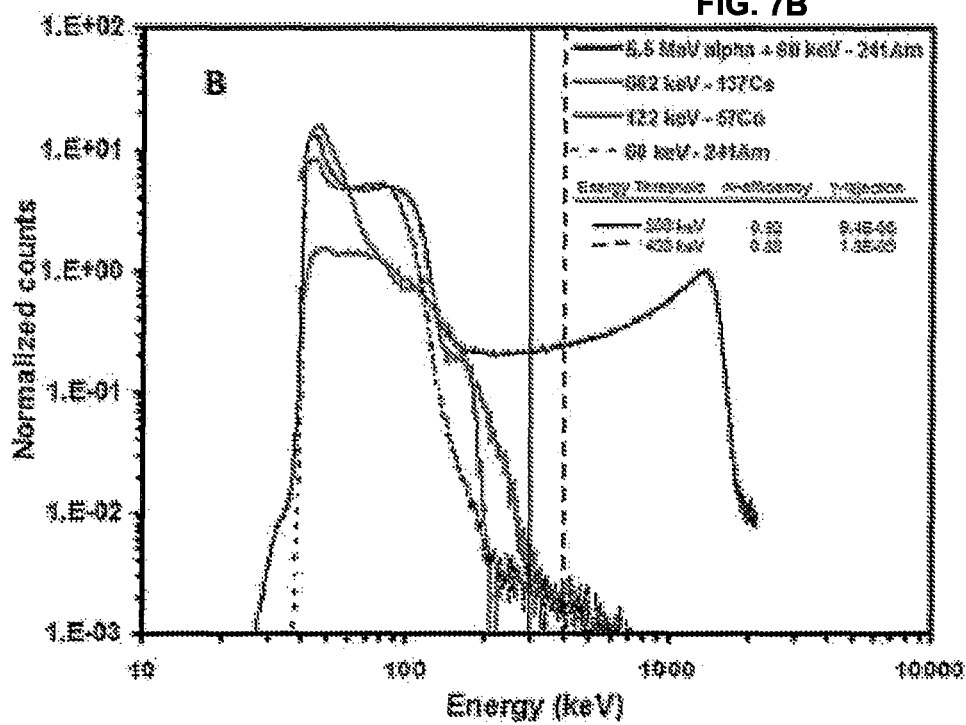

This example describes growth of $CeBr_3$ films using hot wall evaporation, the method that can produce relatively inexpensive large area, thick films in desired shapes or sizes. The $CeBr_3$ material could be grown in polycrystalline form suitable for spectroscopic applications, or even in the microcolumnar form desirable for high spatial resolution gamma ray imaging. Films produced using this approach possess all of the excellent properties of their melt-grown crystal counterparts. FIG. 7A shows light yield and energy resolution of as-fabricated 1 mm $CeBr_3$ film approaching that of a $LaBr_3$:Ce commercial single crystal. FIG. 7B is a response of a 20 micron thick $CeBr_3$ film to 5.5 MeV alpha particles from $^{241}$Am source demonstrating high detection efficiency and excellent gamma ray rejection. Also plotted are the response of the same film to 60 keV $^{241}$Am, 662 keV $^{137}$Cs, and 122 keV $^{57}$Co gamma rays, showing excellent gamma ray discrimination.

Example 3

Pre-synthesis of $Ba_2CsI_5$:Eu Polycrystals for Fabrication of $CsBa_2I_5$:Eu Scintillator Films Vertical Bridgman Process:
This example describes pre-synthesis of polycrystals of europium-doped, ternary inorganic compound $Ba_2CsI_5$. Pre-synthesis $Ba_2CsI_5$:Eu polycrystals used a simplified vertical Bridgman's method. The polycrystals were grown from CsI, $BaI_2$ and $EuI_2$ powder beads. The quartz ampoules containing this admixture were evacuated, sealed and then heated in the furnace up to 700 C, beyond its melting point. This provided for the formation of a homogenous liquid melt which was conducive for the formation of $Ba_2CsI_5$:Eu singular- or mono-phase. Several such growth runs were performed to synthesize "$Ba_2CsI_5$:Eu pre-synthesis charges" with varying concentrations of $Eu^{2+}$ in the range of 1 to 10% (mole %), to study the effect of Eu dopant concentration on scintillation properties.

Light Yield (Pre-Synthesis):
As the $Ba_2CsI_5$:Eu scintillators in their polycrystalline formats with variations in Eu concentrations were fabricated, we performed detailed characterizations of their light yield. The optical signal produced by a specimen when irradiated with a $^{57}$Co source (122 keV photons) were measured using a PMT coupled to standard NIM electronics (Canberra #2003 preamplifier, Canberra #2020 amplifier), and the spectrum were recorded using an Oxford Instruments MCA. A commercial single-crystal $LaBr_3$:Ce scintillator with known light yield of 55,000 photons/MeV available at RMD was used as a standard for comparison. By comparing the 122 keV photopeaks in all cases, the relative light output of various $Ba_2CsI_5$:Eu specimens was determined. The light output of $Ba_2CsI_5$:Eu polycrystals varied as Eu concentrations changed. The highest light output was estimated to be ~70,000 ph/Mev at 5% Eu by mole %, taking into account the ratio between the centroid positions and quantum efficiencies of the super bi-alkali PMT for the $LaBr_3$:Ce reference and $Ba_2CsI_5$:Eu crystals. This result gave insight into the stoichiometry in $Ba_2CsI_5$:Eu films for achieving a bright material.

Afterglow (Pre-Synthesis):
Due to the high speed nature of CT imaging, the afterglow of the scintillator is a important parameter for CT imaging. To minimize artifacts arising from excessive persistence, afterglow of a scintillator should be minimal. Therefore, the afterglow measurements of $Ba_2CsI_5$:Eu are useful in ascertaining its use for CT applications. These measurements were performed by exciting the polycrystal specimens by means of a Golden Engineering XRS-3 source, which provides X-ray pulses 20 ns FWHM, with nominal maximum photon energy of 250 kVp. The scintillation response from the specimens is passed through a 0.2-m McPherson monochromator, detected by a Hamamatsu R2059 photomultiplier, and re-corded by a Tektronix TDS220 digital storage oscilloscope. The pre-synthesized polycrystals demonstrated low afterglow, which is important for CT applications. For example, the polycrystals showed the afterglow results after 2 ms interval following an X-ray pulse, for different specimens as a function of its Eu dopant concentration. The trend seems to show that as the Eu concentration increases, the afterglow increases as well. The afterglow of 0.3% for $Ba_2CsI_5$:5% Eu is notable considering the current standard CsI:Tl whose afterglow is nearly 5-10% at 2 ms.

X-Ray Diffraction Studies:
One aspect of the pre-synthesis polycrystals is the formation of $Ba_2CsI_5$:Eu "mono-phase". Phase identification was performed on the pre-synthesis polycrystals of $Ba_2CsI_5$:Eu by powder X-ray diffraction (XRD). The measurement was performed with a Bruker Nonius FR591 rotating anode X-ray generator equipped with a Cu target at a 50 kV and 60 mA electron beam.

XRD patterns for three polycrystal samples were obtained as well as the standard diffraction pattern of $Ba_2CsI_5$ calculated from single-crystal data. PC100A is as-fabricated sample, while PC100B-V specimen was subjected to high-vacuum ($10^{-6}$ Torr) for 24 hours post-fabrication. The sample PC100A-VH sample was annealed at 100-125° C. in high-vacuum for 1 hour. The peak positions of all three samples match well with the pattern derived from the single crystal structure. No impurities corresponding to reactants or undesired products were visible, thus confirming that the 3 samples are $Ba_2CsI_5$. However, the degree of crystallinity differed from sample to sample, and as expected, annealed sample (PC100A-VH) exhibited better crystallinity than the rest. While not being bound by any particular theory, this can be explained by the presence of free iodine in the crystal matrix of $Ba_2CsI_5$. The source of free iodine is the anion part of $EuI_2$, which is added during the pre-synthesis fabrication by Bridgman's process. It is also possible for factory-shipped $BaI_2$ to have excess iodine. In any case, the excess iodine precipitates on the grain boundaries and hinders crystallization of $Ba_2CsI_5$ during the crystal growth. Hence as a result, it can be seen that post-fabrication annealing helps de-gas the excess iodine in vacuum and improves its crystallinity for producing highly crystalline mono-phase $Ba_2CsI_5$:Eu. From the standard reference it is deduced that single-crystal $Ba_2CsI_5$:Eu has a monoclinic $P2_1/c$ space group with cell parameters a=10.541 Å, b=9.256 Å c=14.637 Å; β=90.194°.

Compositional Analysis (Polycrystals):

The preliminary qualitative compositional analysis was carried out using X-ray fluorescence (XRF) microscopy. It is a non-destructive technique that utilizes the photoelectric interaction of radiation with matter to produce a signal that is proportional to elemental concentration. The basic principle is that ionizing radiation induces photoelectric absorption in the test material for the elements of interest, followed by emission of characteristic X-rays that can be detected, isolated and counted. We have adapted a portable device, LeadTracer-ROHS™ from RMD Instruments Inc. originally designed for the screening of lead and mercury, to quantify the Cs, Ba, I and Eu concentrations in $Ba_2CsI_5$:Eu scintillator. It uses a $^{57}Co$ source to excite the sample with 122 keV gamma rays, and then detects the resulting X-ray fluorescence from the sample using a CdTe detector that provides ~700 eV energy resolution. The compositional analysis showed the formation of the "mono-phase" of $Ba_2CsI_5$ in the pre-synthesis step.

Example 3

Fabrication of $CsBa_2I_5$:Eu Scintillator Films with Physical Vapor Deposition $Ba_2CsI_5$:Eu is a scintillator, well suited for next-generation radiography. $Ba_2CsI_5$:Eu has an estimated light yield of ~100,000 ph/MeV, and its X-ray excited emission wavelength, detected around 430 nm, can be tailored to match the response of CMOS, CCDs or a-Si:H flat panel detectors. The higher density of $Ba_2CsI_5$:Eu (5.04 gm/cm$^3$) affords higher stopping power than CsI:Tl (4.53 gm/cm$^3$). As-deposited films of $Ba_2CsI_5$:Eu, fabricated via physical vapor deposition, exhibit highly structured morphology, which can be optimized either for high spatial resolution or high light output. Its fast decay and low afterglow make $Ba_2CsI_5$:Eu ideally suited for high frame-rate applications.

The next generation of medical, security, industrial and scientific X-ray imaging systems demands a high performance scintillator with outstanding properties of high sensitivity, high resolution, high brightness, high speed, and favorable energy of light emission. Here, this example reports on $Ba_2CsI_5$:Eu, a novel high-performance scintillator well suited for such radiography, fabricated as a thin film via physical vapor deposition (PVD) onto a suitable (typically radiolucent) substrate. $Ba_2CsI_5$:Eu is a bright scintillator with an estimated light yield of ~100,000 photons/MeV. While the peak X-ray excited emission wavelength of both crystalline and thin film $Ba_2CsI_5$:Eu are 430 nm, the emission spectrum of the thin film form shows significant broadening compared to the crystal sample. This implies that the emission properties can be tailored to match the sensitivities of photodetectors such as CMOS, CCDs or a-Si:H flat panels. The density of $Ba_2CsI_5$:Eu (5.04 gm/cm$^3$) is higher than traditional sensors such as CsI:Tl (4.5 gm/cm$^3$), and thus affords higher stopping power. The PVD-deposited films exhibit structured cross-sections, which can be optimized either for high spatial resolution in amorphous microcolumnar structure (AMS) form or for high light output in crystalline microcolumnar structure (CMS) form. The decay characteristics of $Ba_2CsI_5$:Eu demonstrate <0.05% afterglow at 2 ms following X-ray excitation, making it ideally suited for high frame rate applications such as fluoroscopy and cone beam CT (CBCT).

Figure 8A:
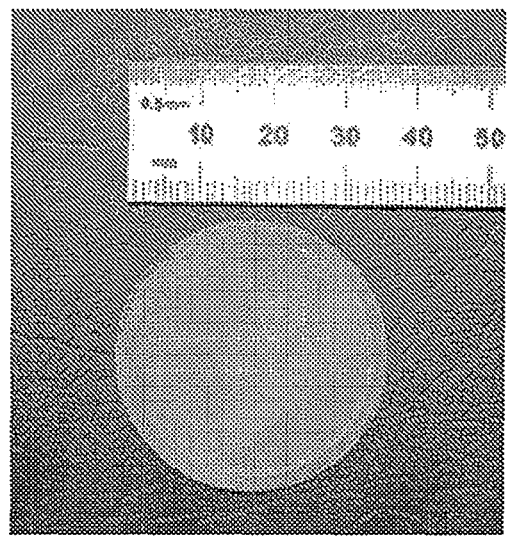
FIGS. 8A and 8B shows a fabricated $CsBa_2I$:Eu scintillator film and comparison spectra for the scintillator, respectively, according to an embodiment of the present invention.
Figure 8B:
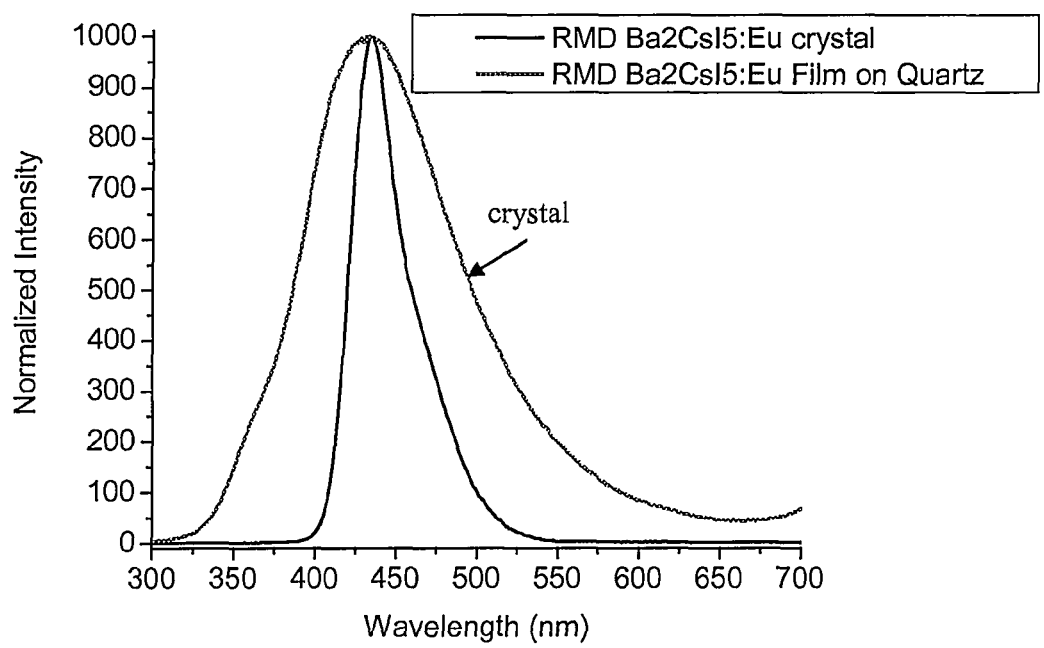

This example describes a scintillator, $Ba_2CsI_5$:Eu, (FIG. 8A) as an X-ray sensor material for next-generation radiography, and demonstrates its efficacy for high-sensitivity, high-resolution X-ray imaging through its integration into existing imaging detectors. This recently discovered scintillator is fast and offers effectively unprecedented scintillation efficiency of ~400,000 optical ph/MeV. Its emission, centered around ~430 nm (FIG. 8B), can be tailored to suit CMOS, CCDs or a-Si:H flat panel detectors. This bright emission, along with its afterglow-free fast decay, makes it ideally suited for high frame rate imaging and other "light-starved" applications.

$Ba_2CsI_5$:Eu is fabricated via the physical vapor deposition (PVD) method of thermal evaporation in microcolumnar form, a structure that minimizes the traditional tradeoff between spatial resolution and detector X-ray absorption efficiency. Films fabricated in crystalline microcolumnar structure form can be used to retrofit pixelated scintillators in existing CT systems. Amorphous microcolumnar structure forms can be directly deposited onto flat panel detector arrays suitable for new dedicated, organ-specific cone beam CT (CBCT) or radiography systems. Both forms can be grown in dimensions suitable for conventional photodiode coupling or for coupling to large-format CMOS, CCDs or a-Si:H flat panel detectors, and their thickness can be tailored to maximize absorption efficiency for 140 kVp X-rays typically used in medical CT.

Figure 9:
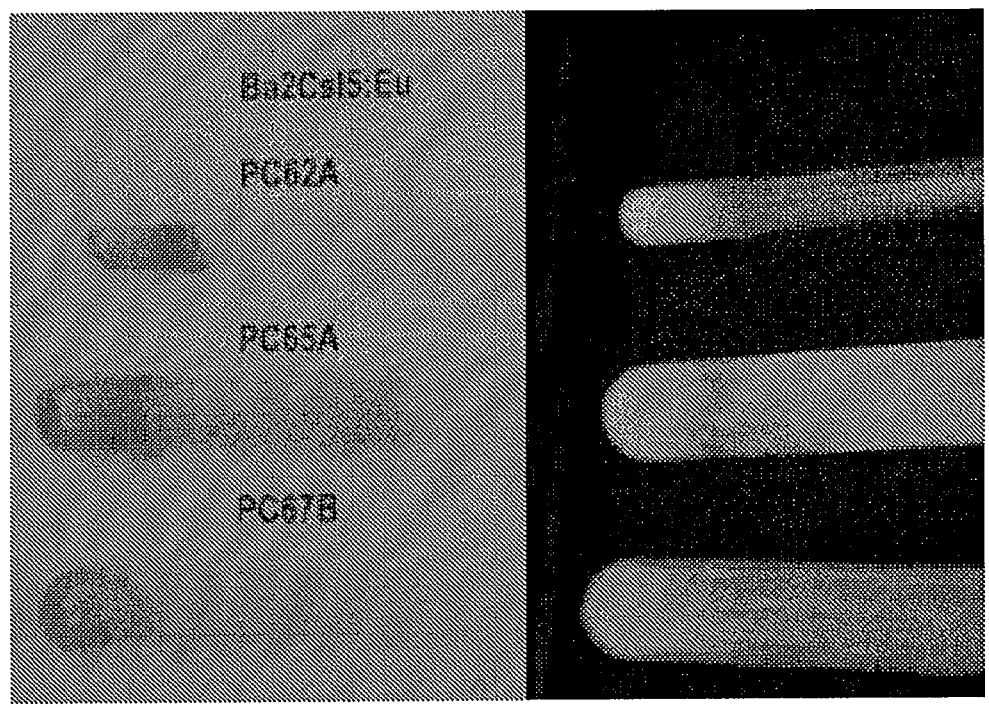
FIG. 9 shows melt-grown crystals synthesized at using a vertical Bridgman furnace, according to an embodiment of the present invention.

$Ba_2CsI_5$:Eu is a new material and is not yet available commercially in a form amenable to our vapor deposition growth needs. Consequently, in order to pursue PVD fabrication, melt-grown crystals were pre-synthesized at using a vertical Bridgman furnace. Several growth runs were performed to synthesize these crystals, with varying concentrations of $Eu^{2+}$ dopant. FIG. 9 shows some of these crystals under normal and UV illumination. Subsequently, the pre-synthesized crystals were thermally evaporated in a hot wall crucible under high vacuum conditions onto a quartz substrate. The films fabricated so far are only ~30 μm thick, but they are 5 times brighter than conventional MinR 2000 screens under identical exposure conditions. More light is anticipated with thicker films, due to higher X-ray absorption. The X-ray excited emission spectrum of the film shows significant broadening compared to that of a crystal (see FIG. 8B). These data demonstrate that emission properties may be tailored to match the response of the photodetector.

This example describes a vapor-deposited ternary compound in a microcolumnar format. This material, in the described CMS and AMS morphologies, is expected to be a breakthrough for the radiography community in general and medical imaging in particular. Additionally, owing to its fast decay and low afterglow, $Ba_2CsI_5$:Eu is well suited for high speed radiography, fluoroscopy or CBCT applications. This material has the potential to provide high spatial resolution along with high brightness and enhanced X-ray absorption, enabling development of detectors with high detective quantum efficiency (DQE(f)).

This example focuses on the fabrication and characterization of a novel scintillator, $Ba_2CsI_5$:Eu, in microcolumnar forms that possess traits to qualify as the next generation sensor for radiography. Practical and cost-effective designs and processes have been identified to fabricate $Ba_2CsI_5$:Eu films suitable for use in X-ray imaging and to integrate them into current detectors, which make it a promising, high-performance scintillator for demanding applications.

Example 4

Fabrication of $CsBa_2I_5$:Eu Scintillator Films with Hot Wall Evaporation and Thermal Evaporation This portion of the example describes a $Ba_2CsI_5$:Eu scintillator in a crystalline microcolumnar (CMS) and amorphous microcolumnar (AMS) format, made using hot wall evaporation. An HWE apparatus similar to the apparatus in FIG. 4 can be used to make the $Ba_2CsI_5$:Eu films. Numerous CMS samples were fabricated via HWE method using the pre-synthesis polycrystals with variation in dopant concentration from 1 to 15%. Prior to any characterization, the films were protected from moisture by performing a barrier coating of 5 to 8 µm film of Parylene C. The coated samples were further protected by housing it in an aluminum casing, whose hermetic sealing was carried out in a glovebox with <0.5 ppm moisture and oxygen ambience. One example scintillator was a hermetically sealed $Ba_2CsI_5$:Eu sample measuring 100 µm in thickness and 6 cm in diameter (on a quartz substrate).

Figure 10:
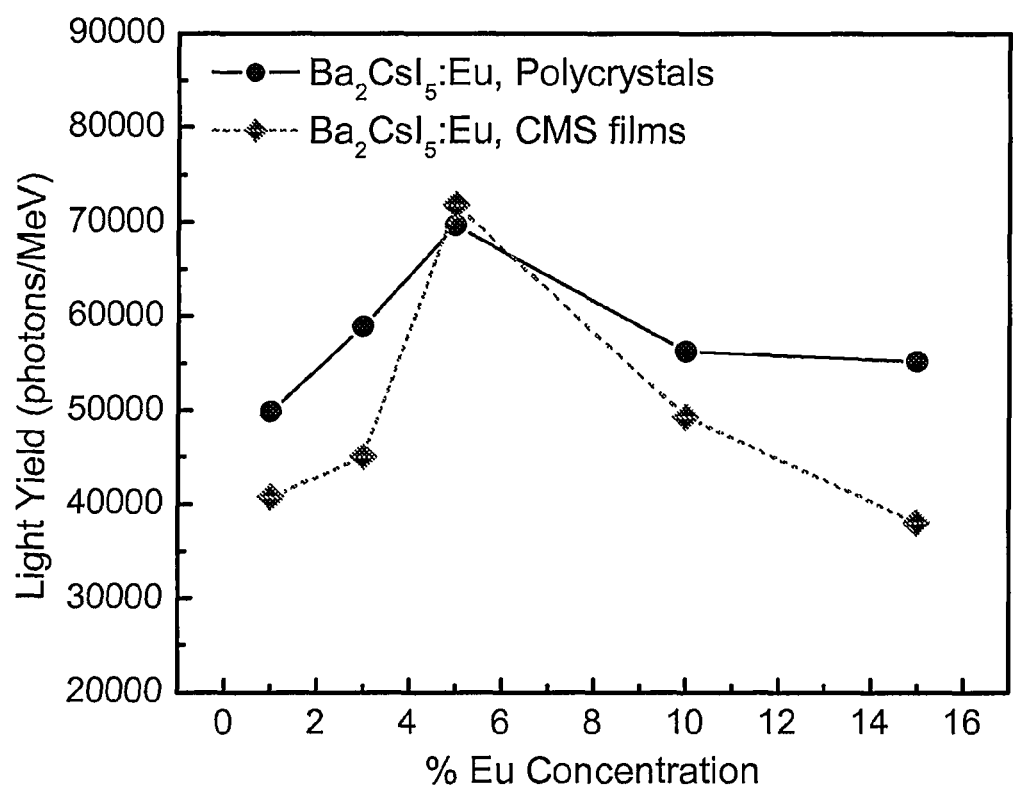
FIG. 10 depicts a comparison between light yield of $Ba_2CsI_5$:Eu polycrystals and $Ba_2CsI_5$:Eu scintillator films at varied $Eu^{2+}$ concentrations, according to an embodiment of the present invention.

Light Yield:

The light yield for CMS sample was measured using the super bi-alkali PMT setup as described previously for the polycrystalline samples. The light yield was estimated in reference to the commercial $LaBr_3$:Ce standard and by accounting for the detector quantum efficiency for its emission wavelength (380 nm) with respect to $Ba_2CsI_5$:Eu(450 nm). FIG. 10 shows the light output of the films as a function of its nominal Eu concentration in its starting material (pre-synthesized material). The trend in light yield for CMS films and their starting materials trace each other very closely, as the Eu doping concentration is varied from 1 to 15%. This examples demonstrates the capability of an optimized HWE process to reproduce melt-grown crystal's scintillation properties in CMS films. The best performance in terms of brightness was measured in CMS film with 5% Eu and is estimated be me >70,000 ph/MeV.

This portion of the example describes fabrication of microcolumnar $Ba_2CsI_5$:Eu scintillator films using thermal evaporation. The resulting microcolumnar structure conserves and promotes channeling of the scintillation light by means of total internal reflection, thereby suppressing lateral light spread within the film. This allows, e.g., fabrication of a thicker film for higher X-ray absorption without sacrificing spatial resolution for cone beam CT (CBCT) applications.

Figure 11:
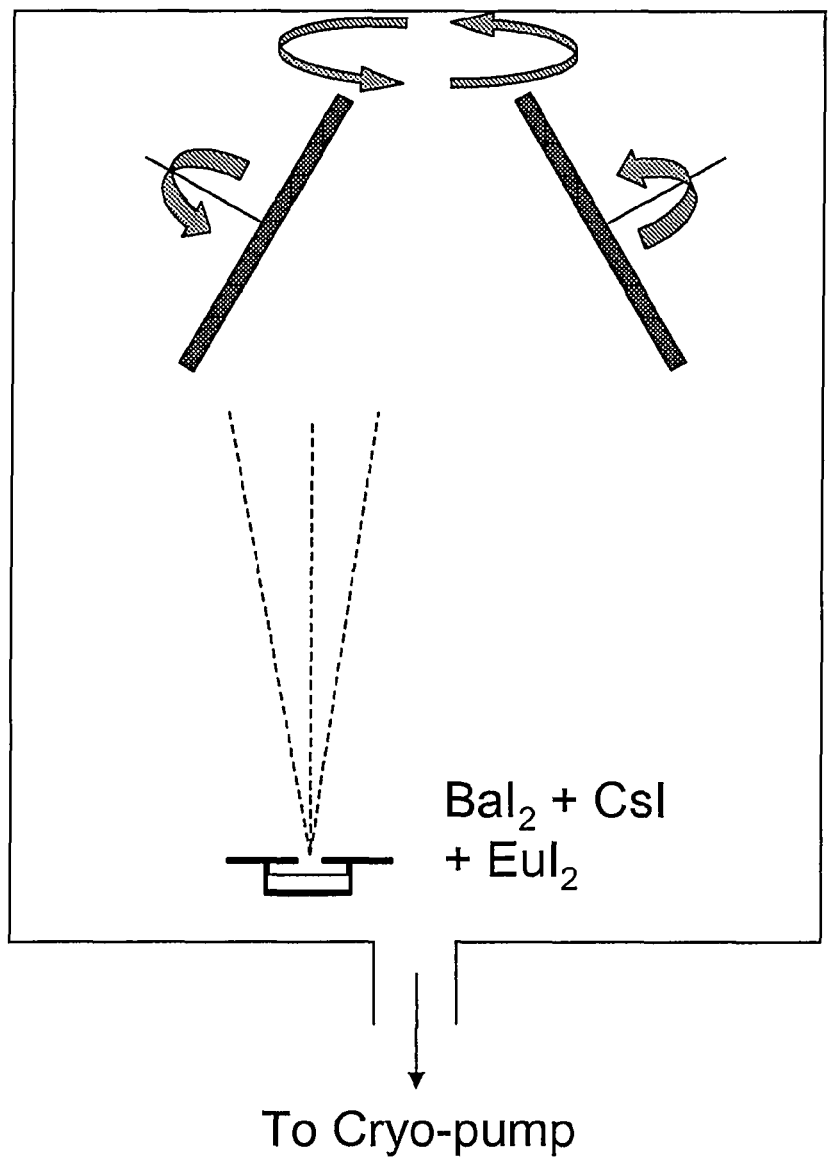
FIG. 11 shows an example thermal evaporation apparatus, according to an embodiment of the present invention.

Thermal Evaporation:

The schematic for the thermal evaporation used for fabrication of AMS $Ba_2CsI_5$:Eu films is shown FIG. 11. The deposition was carried out by evaporating a pre-calculated admixture of $BaI_2$, CsI and $EuI_2$ beads from a single heated crucible. The substrates were loaded on the planetary tool plates, which permitted angular deposition on their surfaces and the ambient substrate temperatures were maintained at 50-60° C., all of which favored AMS growth. The admixture was heated to 350° C. in the crucible under vacuum condition for 2 hours to dehydrate and following which it was heated to 600° C. for the formation of liquid melt phase of $Ba_2CsI_5$:Eu. The evaporation was then proceeded by opening the shutter between the charge and the rotating substrates. Aluminum coated (reflector) graphite substrates (low-Z) were used as substrates in this endeavor. $Ba_2CsI_5$:Eu material is somewhat hygroscopic in nature and its water uptake from atmospheric moisture can be detrimental to the scintillator performance. Hence it can be important to protect the scintillator plated by providing a good moisture barrier coating. Parylene C coats on the as-deposited film (e.g., 5-7 µm) provided a good moisture barrier protection without altering the light transmission properties.

Figure 12:
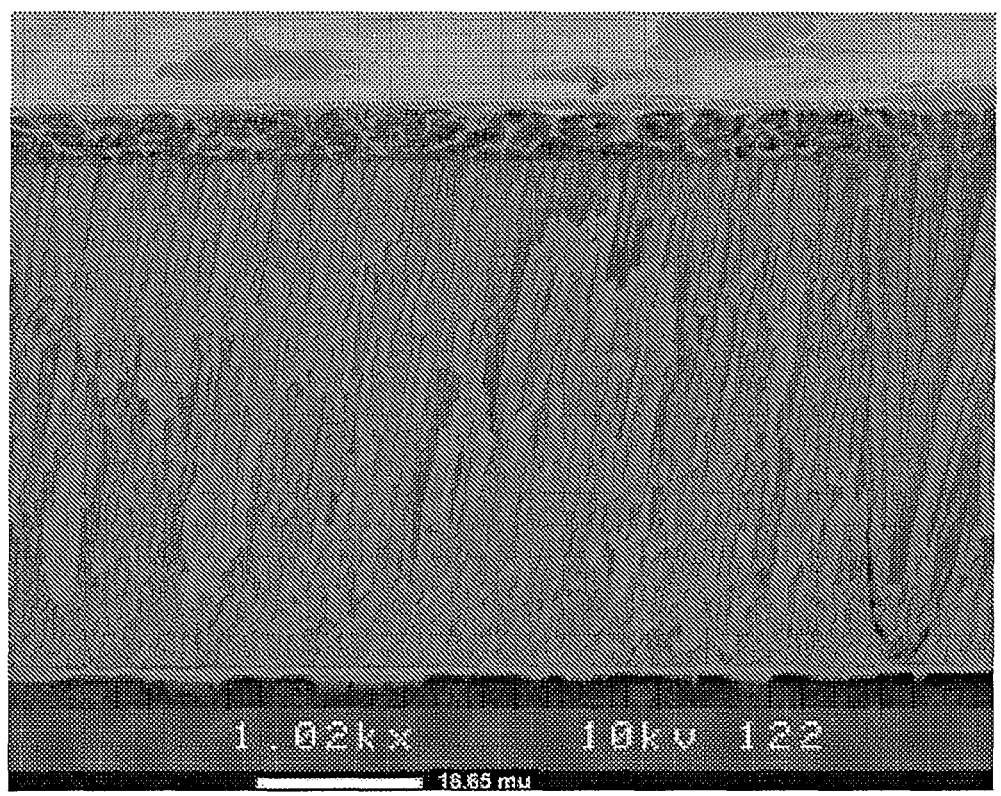
FIG. 12 provides a scanning electron microscope image of a cesium barium halide scintillator, according to an embodiment of the present invention.

Microcolumnar Morphology:

Scanning electron microscopy (SEM) was performed on the cross-section of a freshly cleaved AMS $Ba_2CsI_5$:Eu film. FIG. 12 shows the SEM characterization of the microcolumnar morphology of the film along with the Parylene protection on the top surface. The film thickness measures a total of ~50 µm and the column diameters are ~0.5 to 1 µm.

Spatial Resolution Measurements:

The spatial resolution of the scintillators were evaluated by measuring a pre-sampled line spread function (LSF) followed by a fast Fourier transform (FFT) of the LSF to obtain the modulation transfer function (MTF(f)). A 10 µm wide tantalum slit oriented at a <1° angle relative to the CCD pixel row (or column) direction was imaged to obtain the pre-sampled LSF with a sampling interval of 0.7 µm or less. The acquired MTF data showed that a 50 µm thick $Ba_2CsI_5$:Eu AMS film exhibited resolution of 6 LP/mm (~80 µm) spatial resolution as a function of spatial frequency.

Emission Spectrum:

The X-ray excited emission spectra of various scintillator samples was measured using an existing setup, with the sample under investigation excited by the 8 keV Cu Kα line. To generate the required flux at the sample, the X-ray generator was operated at 40 kV with 20 mA current. The resulting scintillation light was collected in a MacPherson 0.2 m monochromator (model 234/302) that separates the light into its wavelength components. The intensity of the selected wavelength was registered using an RCA model C31034 photomultiplier tube (PMT). The operation of the whole instrument, including the X-ray trigger, the rotation of the monochromator to select the wavelengths, and the data acquisition and analysis was software controlled.

Figure 13:
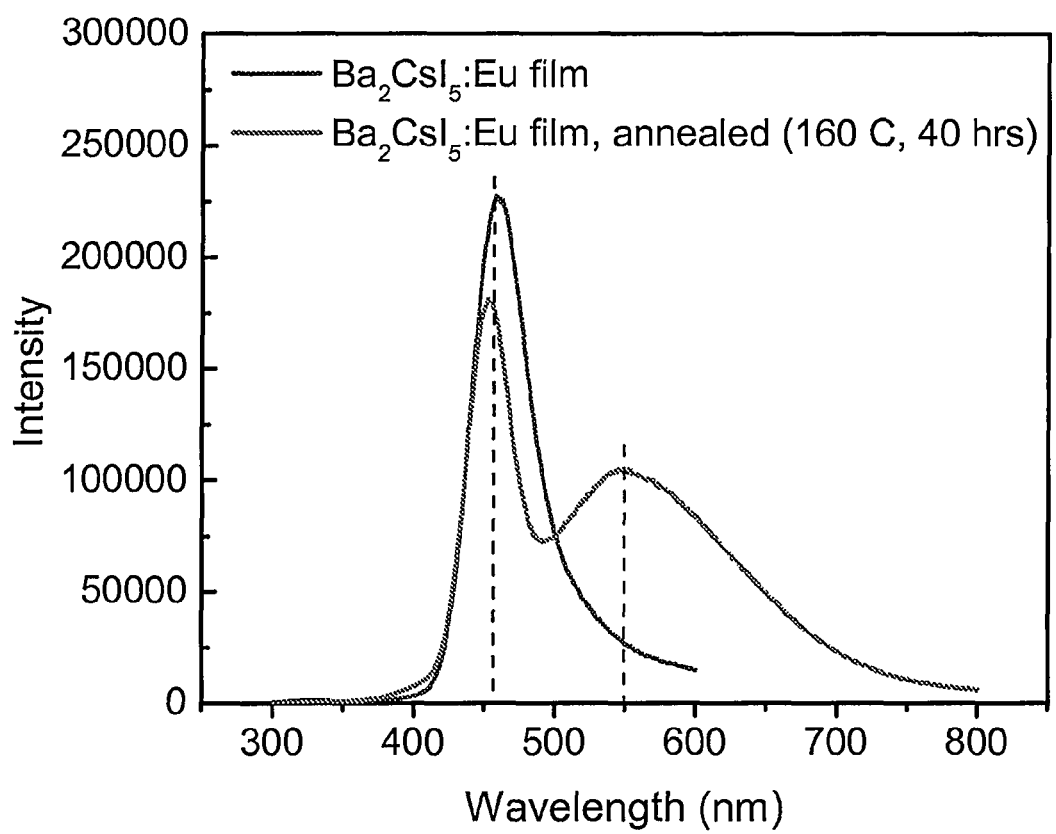
FIG. 13 illustrates a spectral comparison between a $Ba_2CsI_5$:Eu scintillator film and an annealed $Ba_2CsI_5$:Eu scintillator film, according to an embodiment of the present invention.

As shown in FIG. 13, the as-deposited $Ba_2CsI_5$:Eu AMS sample emitted at ~450 nm which is characteristic of $Eu^{2+}$ dopant activity. When the sample was annealed at 160 C for 40 hours, the emission spectra showed a significant number of photons (60%) had red-shifted to 550 nm, in addition to its main emission at 450 nm. This is can be useful for CBCT as most of the sensors (CCDs, CMOS, or a-Si:H flat panels) have high sensitivity in 550 nm (green) range. While, not bound by any particular theory, this shift may be due to the rearrangement within the lattice, where the $Eu^{2+}$ impurity moves from interstitial to lattice positions, allowing transitions that favor green emission.

X-Ray Characterization:

Light output measurements were made by coupling AMS $Ba_2CsI_5$:Eu films measuring 50 µm thickness (20 mg/cm²)

to an electron multiplying CCD via a 3:1 fiber optic taper. The film was exposed to a uniform flood field of 70 kVp X-rays and resulting analog-to-digital unit values (ADUs) were averaged over a pre-defined region of interest. Similar measurement was repeated on commercial $Gd_2O_2S$ (GOS) screen (MinR-2000, 34 mg/cm$^2$) for the sake of comparison. The as-deposited AMS film measured 450 ADUs compared to 1800 ADUs for MinR under similar X-ray conditions. This is primarily due to very low (<5%) quantum efficiency of the CCD to 450 nm wavelength of $Ba_2CsI_5$:Eu compared to 55% QE for the GOS 540 nm light. By correcting for quantum efficiencies of the CCD at different emissions and by accounting for X-ray absorptions arising from different mass thicknesses of the two scintillators, the estimated brightness for $Ba_2CsI_5$:Eu film is 13,500 ADUs compared to MinR's 3400 ADUs. This result implies that $Ba_2CsI_5$:Eu scintillator's light output is almost 4 times greater than commercially available GOS screens. The as-deposited samples were annealed in Ar environment for 40 hours at 160° C. Annealing process remove defects in the films, remove any non-uniformity in dopant distribution and improve the microcolumnar morphology. And as a result, a 11% increase in the ADU was registered following annealing of the film.

Figure 14:
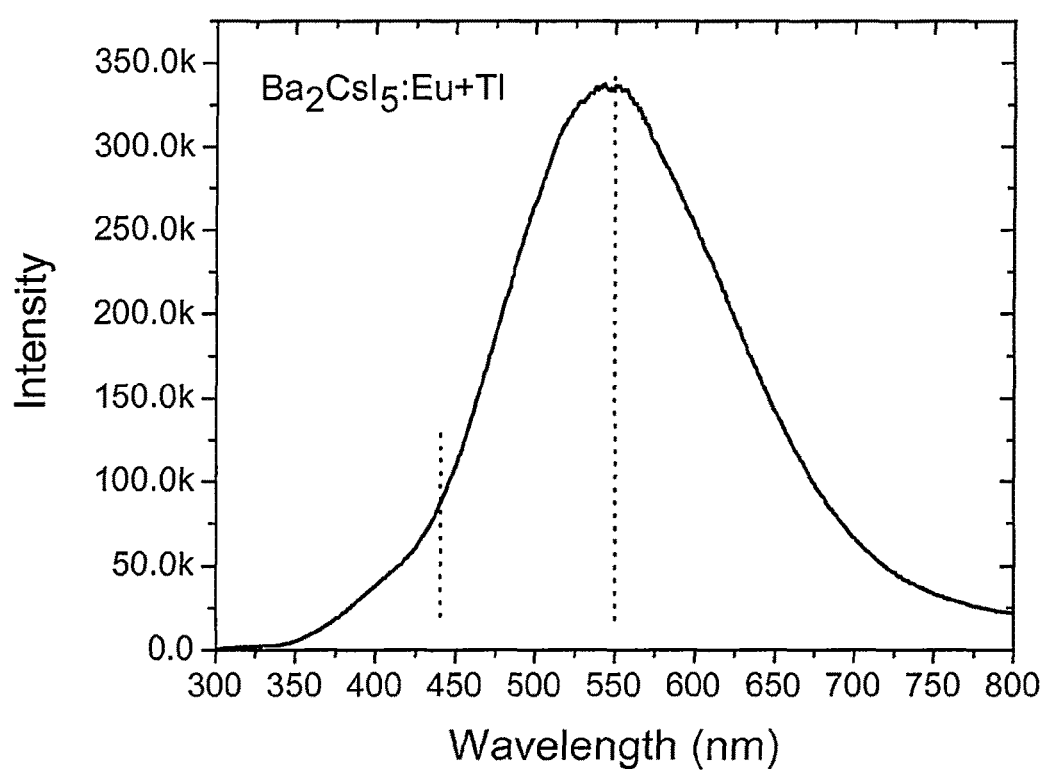
FIG. 14 shows an emission spectrum of a $Ba_2CsI_5$:Eu+Tl, dual-doped scintillator film, according to an embodiment of the present invention.

Dual Doping with Tl+Eu:

Using the schematic for the thermal evaporation described above, fabrication of dual doped AMS $Ba_2CsI_5$ films were produced. Dual doping can induce a red shift emission spectrum for the $Ba_2CsI_5$ host from 450 to 550 nm, to, e.g., improve its sensitivity to CCD, a-Si:H, or SiPM detectors. The dopants selected to achieve this effect were thallium and europium. The deposition was carried out by evaporating polycrystals of $Ba_2CsI_5$:5% Eu and thallium iodide (Tll) beads in two independently controlled tantalum crucibles. The substrates were loaded on the planetary tool plates, which permitted angular deposition on their surfaces and the ambient substrate temperatures were maintained at 50-60° C., all of which favored AMS growth. The resulting films were 60 μm thick and exhibited microcolumnar morphology and line-pair resolution. The spectral emission of dual-doped $Ba_2CsI_5$:Eu,Tl films is shown in FIG. 14.

Light output measurements were made by coupling AMS $Ba_2CsI_5$:Eu,Tl films measuring 60 μm thickness (24 mg/cm$^2$) to an electron multiplying CCD via a 3:1 fiber optic taper. The film was exposed to a uniform flood field of 70 kVp X-rays, in a setup as described previously. The as-deposited AMS film measured 2880 ADUs compared to 1800 ADUs for MinR 2000 standard GOS screen under similar X-ray conditions. Dual doped film and MinR 2000 practically have the same emission wavelength and hence do not need any correction for quantum efficiencies. However, by correcting for X-ray absorptions arising from different mass thicknesses of the two scintillators, the estimated brightness for dual doped $Ba_2CsI_5$:Eu,Tl film is 2 times greater than commercially available GOS screens. A more orchestrated approach is needed to understand the collective effect of multiple activators in any given scintillator host, nevertheless dual doping of $Ba_2CsI_5$ is a promising pathway to engineer its emission wavelength for improving its sensitivity to various detectors such as CCD, a-Si:H, and SiPMs etc.

Example 5

Imaging with $CsBa_2I_5$:Eu Scintillator Films

Figure 15:
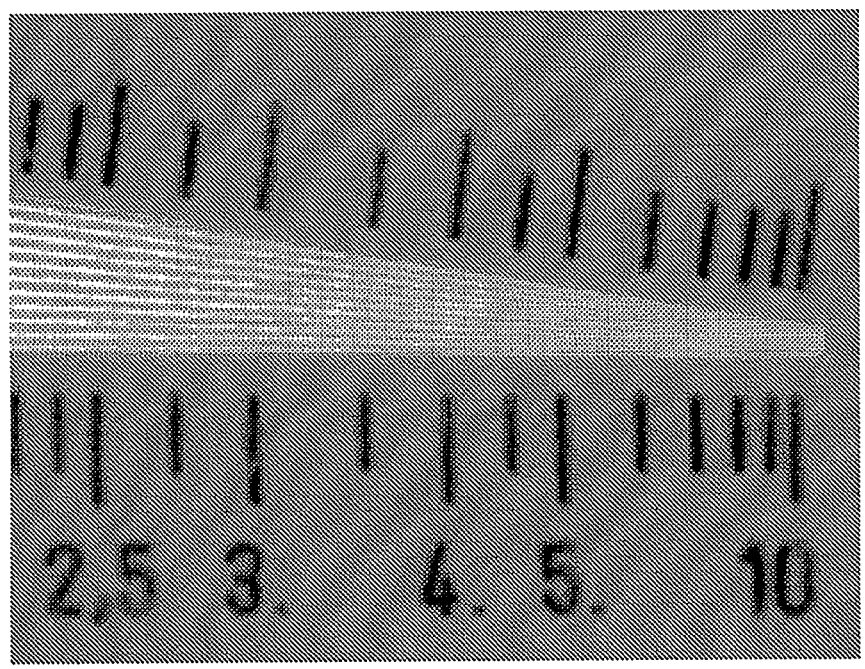
FIG. 15 depicts a line phantom image acquired using a $Ba_2CsI_5$:Eu scintillator film, according to an embodiment of the present invention.

X-Ray Radiographic Imaging:

To illustrate the X-ray imaging capability, $Ba_2CsI_5$:Eu films were coupled to an EMCCD via a 3:1 taper. The X-ray source-to-detector distance was 45 cm, and the imaged object was placed in contact with the CCD front end. Thus, there is no optical magnification in registered images and resolution reflects true resolution of the film (EMCCD has a very high intrinsic resolution of 39 μm, or ~13 lp/mm). FIG. 15 shows an acquired radiography image of a line-pair phantom. The image shows excellent spatial resolution, especially the line-pair phantom which demonstrates 6 LP/mm resolution and contrast (CTF(f)) consistent with modulated transfer function (MTF(f)) data.

Dynamic X-Ray Imaging:

Dynamic X-ray imaging with a $Ba_2CsI_5$:Eu film was evaluated. To this end, dynamic images of a moving toy were acquired by our custom developed CMOS X-ray camera capable of providing 1 k×1 k pixel images at 2000 frames per second. With a reduced field of view, this detector can acquire images at up to 120,000 fps. As such this is an ideal tool to evaluate scintillator screens for high frame rate imaging such as the current CBCT application. During this period, the RMD AMS $Ba_2CsI_5$:Eu film was pressure coupled to this detector and images were acquired at 1000 fps using a Hamamatsu microfocus X-ray source operating at 100 kVp and 100 μA. A single frame of a sequence of images was acquired at 1000 fps. As is evident from the image, the camera (film) shows excellent dynamic range as the plastic gears are clearly visible against the high contrast stainless steel components. Even the plastic gear system inside the rectangular metal frame is clearly visible.

It is understood that the examples and embodiments described herein are for illustrative purposes only and that various modifications or changes in light thereof may be suggested to persons skilled in the art and are included within the spirit and purview of this application and scope of the appended claims. Numerous different combinations of embodiments described herein are possible, and such combinations are considered part of the present invention. In addition, all features discussed in connection with any one embodiment herein can be readily adapted for use in other embodiments herein. The use of different terms or reference numerals for similar features in different embodiments does not necessarily imply differences other than those which may be expressly set forth. Accordingly, the present invention is intended to be described solely by reference to the appended claims, and not limited to the preferred embodiments disclosed herein.

What is claimed is:

1. A scintillator comprising, a ternary scintillator compound comprising a dopant and cesium barium halide, wherein the scintillator is in the form of a microcolumnar scintillator film or a noncolumnar polycrystalline, and wherein the dopant alters the scintillator's afterglow such that the scintillator comprises less than 0.05% afterglow at 2 ms following X-ray excitation.

2. The scintillator of claim 1, wherein the dopant is Eu, Pr, Ce, Tl, Tb, Yb, or any combination thereof.

3. The scintillator of claim 1, wherein the scintillator has a thickness of less than about 20 microns, less than about 500 microns, or less than about 1 cm.

4. The scintillator of claim 1, wherein the scintillator has a thickness greater than about 1 cm, greater than about 3 cm, or greater than about 5 cm.

5. The scintillator of claim 1, wherein the scintillator is in the form of an amorphous microcolumnar scintillator film or a crystalline microcolumnar scintillator film.

6. The scintillator of claim 1, wherein the scintillator further comprises a coating layer comprising doped or undoped cesium iodide.

7. A hot wall evaporation method of making a ternary scintillator, the method comprising:
providing an evaporation chamber having a first end portion with a substrate positioned in a holder, and a second end portion with a first source boat separate from a second source boat, and one or more chamber walls at least partially disposed between the first and second end portions;
positioning a dopant salt in the first source boat and a source salt in the second source boat; and
depositing a scintillator film comprising a source and a dopant on a surface of the positioned substrate;
wherein the film is deposited by a process comprising applying heat to the evaporation chamber so as to vaporize the dopant and the source for film deposition while maintaining a temperature relationship of $T_{wall} > T_{source} > T_{substrate}$ for at least a portion of the deposition process.

8. The method of claim 7, wherein $T_{source}$ is between about 300° C. and about 750° C.

9. The method of claim 7, wherein the scintillator film comprises doped cesium barium halide.

10. The method of claim 9, wherein the dopant comprises Eu, Pr, Ce, Tl, Tb, Yb, or any combination thereof.

11. The method of claim 7, wherein the dopant and the source are included in melt-growth polycrystals positioned in one source boat at the second end portion.

12. The method of claim 7, wherein the scintillator film comprises doped strontium halide.

13. The method of claim 12, further comprising rotating at least one of the first or second source boats comprising source material around a system axis as well as around an axis that is normal to the surface of the source material.

14. The method of claim 13, wherein the at least one of the first or second source boats rotates at a rate of about 1 to 2 rotations per second.

15. A deposition method of making a doped cesium barium halide scintillator, the method comprising:
providing a deposition apparatus comprising a vacuum chamber having a substrate at a first end, and a first source boat comprising cesium iodide and a second source boat comprising barium iodide at a second end of the chamber; and
depositing a scintillator film comprising doped cesium barium halide on the substrate.

16. The method of claim 15, wherein the apparatus comprises a third source boat comprising europium iodide.

17. The method of claim 16, wherein the apparatus further comprises a fourth source boat comprising thallium iodide.

18. The method of claim 15, wherein the dopant comprises Eu, Pr, Ce, Tl, Tb, Yb or any combination thereof.

19. The method of claim 15, wherein the dopant material and the source material are included in melt growth polycrystals positioned in one source boat at the second end portion.

* * * * *